(12) United States Patent
Lan et al.

(10) Patent No.: US 12,300,721 B2
(45) Date of Patent: *May 13, 2025

(54) SEMICONDUCTOR DEVICE STRUCTURE WITH CHANNEL AND METHOD FOR FORMING THE SAME

(71) Applicant: Taiwan Semiconductor Manufacturing Company, Ltd., Hsinchu (TW)

(72) Inventors: Huang-Siang Lan, Hsinchu (TW); Sathaiya Mahaveer Dhanyakumar, Hsinchu (TW); Tzer-Min Shen, Hsinchu (TW); Zhiqiang Wu, Chubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/500,225

(22) Filed: Nov. 2, 2023

(65) Prior Publication Data
US 2024/0063263 A1 Feb. 22, 2024

Related U.S. Application Data

(63) Continuation of application No. 17/217,186, filed on Mar. 30, 2021, now Pat. No. 11,843,032.

(51) Int. Cl.
*H01L 29/06* (2006.01)
*H01L 27/092* (2006.01)
(Continued)

(52) U.S. Cl.
CPC ...... *H01L 29/0673* (2013.01); *H01L 27/0924* (2013.01); *H01L 29/66795* (2013.01); *H01L 29/7851* (2013.01)

(58) Field of Classification Search
CPC ....... H01L 21/02603; H01L 21/823431; H01L 21/823821; H01L 21/845; H01L 27/0886;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — David C Spalla
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first nanostructure over the substrate. The first nanostructure has a (001) surface, the first nanostructure has a first channel direction on the (001) surface, and the first channel direction is [0 1 0] or [0 -1 0]. The semiconductor device structure includes a gate stack surrounding the first nanostructure. The semiconductor device structure includes a first source/drain structure and a second source/drain structure over the substrate and over opposite sides of the gate stack. The first nanostructure is between the first source/drain structure and the second source/drain structure, and the first channel direction is from the first source/drain structure to the second source/drain structure.

20 Claims, 17 Drawing Sheets

(51) Int. Cl.
*H01L 29/66* (2006.01)
*H01L 29/78* (2006.01)

(58) Field of Classification Search
CPC ............. H01L 27/0924; H01L 27/1211; H01L 29/0665; H01L 29/0673; H01L 29/41791; H01L 29/66439; H01L 29/66795; H01L 29/775; H01L 29/785; H01L 29/7851; H01L 29/7853; H01L 29/7855; H01L 2029/7858

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,843,032 B2* | 12/2023 | Lan .................. H01L 29/78696 |
| 2009/0090934 A1* | 4/2009 | Tezuka .............. H01L 29/66795 257/190 |
| 2010/0252814 A1* | 10/2010 | Sekaric ................ H01L 29/125 977/762 |
| 2019/0090934 A1* | 3/2019 | Robinson ........... A61B 18/1206 |
| 2020/0395446 A1* | 12/2020 | Yi ......................... B82Y 10/00 |

\* cited by examiner

SEMICONDUCTOR DEVICE STRUCTURE WITH CHANNEL AND METHOD FOR FORMING THE SAME

CROSS REFERENCE

This application is a Continuation of U.S. application Ser. No. 17/217,186, filed on Mar. 30, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1G-1 is a top view of the semiconductor device structure of FIG. 1G, in accordance with some embodiments.

FIG. 1G-2 is a cross-sectional view illustrating the semiconductor device structure along a sectional line II-IF in FIG. 1G-1, in accordance with some embodiments.

FIG. 1G-3 is a cross-sectional view illustrating the semiconductor device structure along a sectional line III-III' in FIG. 1G-1, in accordance with some embodiments.

DETAILED DESCRIPTION

Figure 1A:
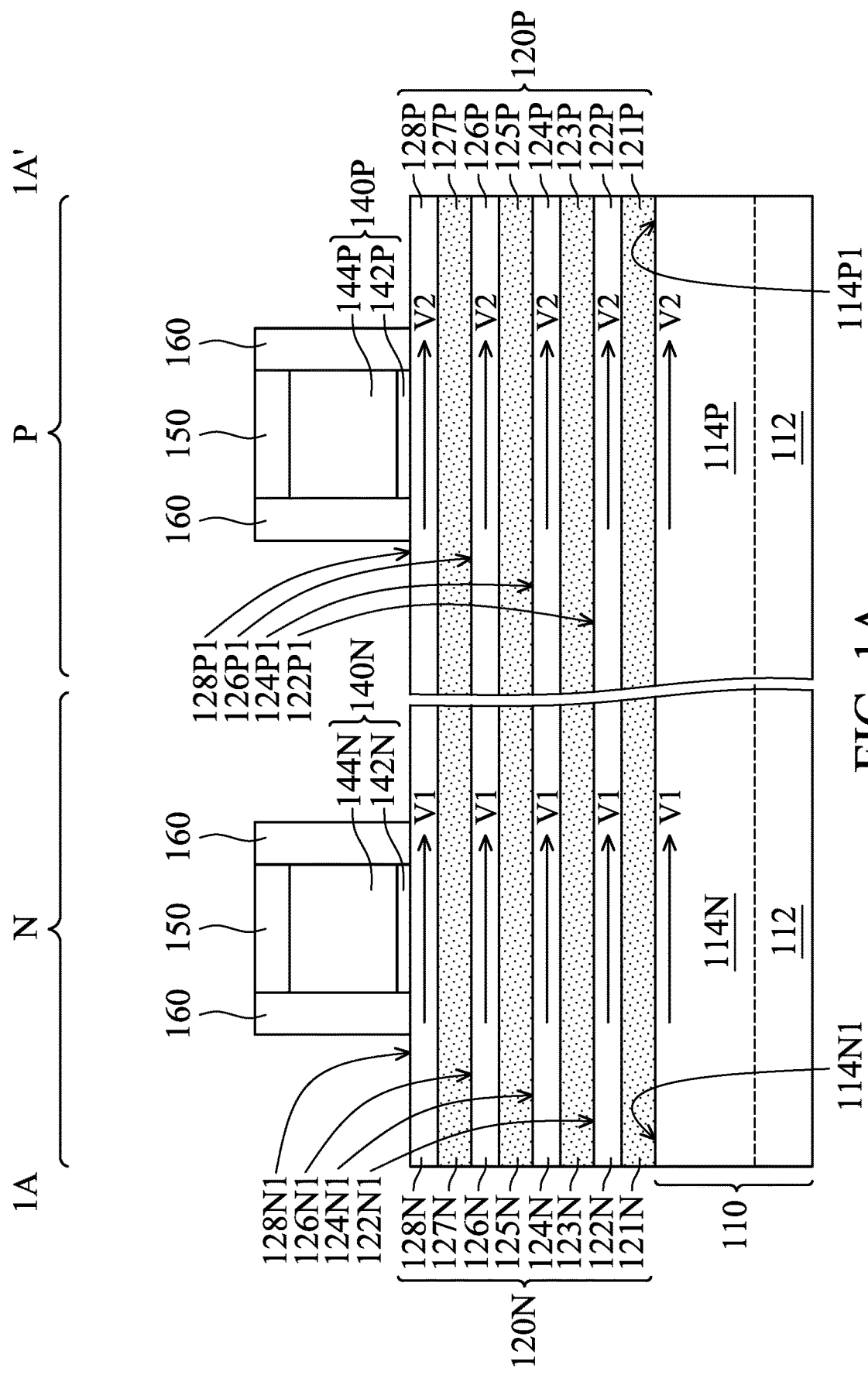
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% or higher, such as 95% or higher, especially 99% or higher, including 100%. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
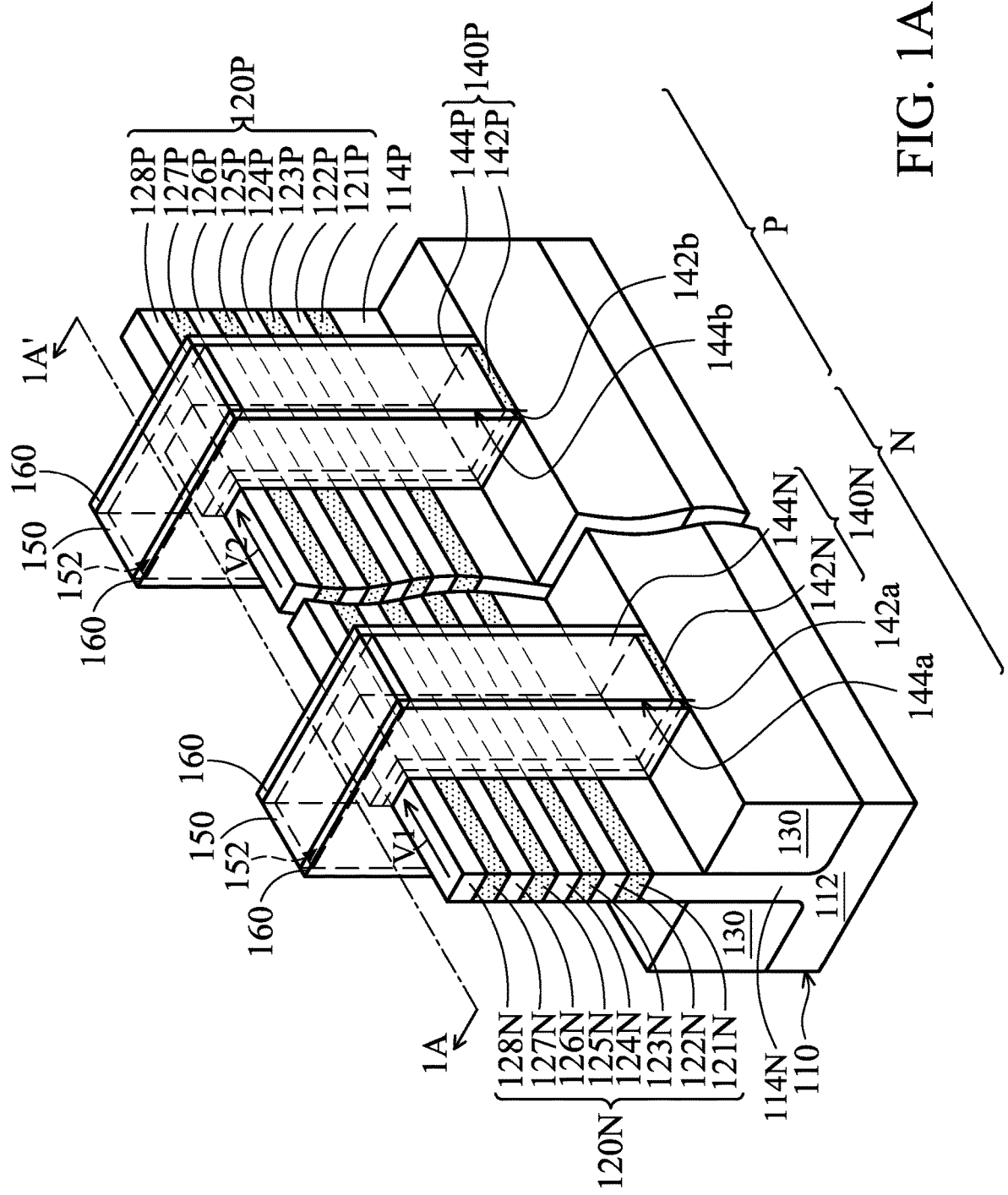

FIGS. 1A-1I are cross-sectional views of various stages of a process for forming a semiconductor device structure, in accordance with some embodiments. FIG. 1A-1 is a perspective view of the semiconductor device structure of FIG. 1A, in accordance with some embodiments.

As shown in FIGS. 1A and 1A-1, a substrate 110 is provided, in accordance with some embodiments. The substrate 110 has a base 112 and fins 114N and 114P over the base 112, in accordance with some embodiments. The fins 114N and 114P have surfaces 114N1 and 114P1, in accordance with some embodiments. The surfaces 114N1 and 114P1 are (001) surfaces, in accordance with some embodiments. Each (001) surface is a (001) surface crystal orientation of the material (e.g., Si) of the substrate 110, in accordance with some embodiments.

The fin 114N has a channel direction V1, in accordance with some embodiments. The channel direction V1 is [1 0 0], [−1 0 0], [0 1 0], or [0 −1 0], in accordance with some embodiments. The fin 114P has a channel direction V2, in accordance with some embodiments. The channel direction V2 is [1 0 0], [−1 0 0], [0 1 0], or [0 −1 0], in accordance with some embodiments. In some embodiments, the channel directions V1 and V2 are the same as each other. In some other embodiments, the channel directions V1 and V2 are different from each other.

The substrate 110 has an N-region N and a P-region P, in accordance with some embodiments. In some embodiments, an N-channel metal oxide semiconductor (NMOS) transistor and a P-channel metal oxide semiconductor (PMOS) transistor are formed in the N-region N and the P-region P respectively in the subsequent process.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, an alloy semiconductor, or a combination thereof, in accordance with some embodiments. The compound semiconductor includes silicon carbide, gallium arsenide, gallium phosphide, indium phosphide, indium arsenide, a combination thereof, or another suitable compound semiconductor material, in accordance with some embodiments.

The alloy semiconductor includes SiGe, SiGeSn (silicon germanium tin), SiGeC (silicon germanium carbide), SiSn (silicon tin), GaAsP, GeSn (germanium tin), a combination thereof, or another suitable alloy semiconductor material, in accordance with some embodiments. The substrate 110 may also include multi-layer semiconductors, semiconductor on insulator (SOI) (such as silicon on insulator or germanium on insulator), or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, nanostructure stacks 120N and 120P are formed over the fins 114N and 114P respectively, in accordance with some embodiments. The nanostructure stack 120N includes nanostructures 121N, 122N, 123N, 124N, 125N, 126N, 127N, and 128N, in accordance with some embodiments.

The nanostructures 121N, 122N, 123N, 124N, 125N, 126N, 127N, and 128N are sequentially stacked over the fin 114N, in accordance with some embodiments. The nanostructures 121N, 122N, 123N, 124N, 125N, 126N, 127N, and 128N include nanowires or nanosheets, in accordance with some embodiments.

The nanostructures 122N, 124N, 126N, and 128N have the channel direction V1, in accordance with some embodiments. The nanostructures 122N, 124N, 126N, and 128N have surfaces 122N1, 124N1, 126N1, and 128N1, in accordance with some embodiments. The surfaces 122N1, 124N1, 126N1, and 128N1 are (001) surfaces, in accordance with some embodiments. Each (001) surface is a (001) surface crystal orientation of the material (e.g., Si) of the corresponding nanostructure 122N, 124N, 126N, or 128N, in accordance with some embodiments.

The nanostructure stack 120P includes nanostructures 121P, 122P, 123P, 124P, 125P, 126P, 127P, and 128P, in accordance with some embodiments. The nanostructures 121P, 122P, 123P, 124P, 125P, 126P, 127P, and 128P are sequentially stacked over the fin 114P, in accordance with some embodiments. The nanostructures 121P, 122P, 123P, 124P, 125P, 126P, 127P, and 128P include nanowires or nanosheets, in accordance with some embodiments.

The nanostructures 122P, 124P, 126P, and 128P have the channel direction V2, in accordance with some embodiments. The nanostructures 122P, 124P, 126P, and 128P have surfaces 122P1, 124P1, 126P1, and 128P1, in accordance with some embodiments. The surfaces 122P1, 124P1, 126P1, and 128P1 are (001) surfaces, in accordance with some embodiments. Each (001) surface is a (001) surface crystal orientation of the material (e.g., Si) of the corresponding nanostructure 122P, 124P, 126P, or 128P, in accordance with some embodiments.

The nanostructures 121N, 121P, 123N, 123P, 125N, 125P, 127N and 127P are all made of the same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122N, 122P, 124N, 124P, 126N, 126P, 128N and 128P are all made of the same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, an alloy semiconductor, or a combination thereof, in accordance with some embodiments. The compound semiconductor includes silicon carbide, gallium arsenide, gallium phosphide, indium phosphide, indium arsenide, a combination thereof, or another suitable compound semiconductor material, in accordance with some embodiments. The alloy semiconductor includes SiGe, SiGeSn, SiGeC, SiSn, GaAsP, GeSn, a combination thereof, or another suitable alloy semiconductor material, in accordance with some embodiments.

As shown in FIGS. 1A and 1A-1, an isolation layer 130 is formed over the base 112, in accordance with some embodiments. The fins 114N and 114P are partially embedded in the isolation layer 130, in accordance with some embodiments. The fins 114N and 114P are surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1A and 1A-1, gate stacks 140N and 140P are formed over the nanostructure stacks 120N and 120P respectively, and a mask layer 150 is formed over the gate stacks 140N and 140P, in accordance with some embodiments. Specifically, the gate stack 140N is formed over the nanostructure stack 120N, the fin 114N, and the isolation layer 130, in accordance with some embodiments. The gate stack 140P is formed over the nanostructure stack 120P, the fin 114P, and the isolation layer 130, in accordance with some embodiments.

The gate stack 140N includes a gate dielectric layer 142N and a gate electrode 144N, in accordance with some embodiments. The gate electrode 144N is over the gate dielectric layer 142N, in accordance with some embodiments. The gate dielectric layer 142N is positioned between the gate electrode 144N and the nanostructure stack 120N, in accordance with some embodiments. The gate dielectric layer 142N is also positioned between the gate electrode 144N and the fin 114N, in accordance with some embodiments. The gate dielectric layer 142N is positioned between the gate electrode 144N and the isolation layer 130, in accordance with some embodiments.

The gate dielectric layer 142N is made of an oxide-containing material such as silicon oxide, in accordance with some embodiments. The gate dielectric layer 142N is formed using a chemical vapor deposition process and an etching process, in accordance with some embodiments. The gate electrode 144N is made of a semiconductor material such as polysilicon, in accordance with some embodiments. The gate electrode 144N is formed using a chemical vapor deposition process and an etching process, in accordance with some embodiments.

The gate stack 140P includes a gate dielectric layer 142P and a gate electrode 144P, in accordance with some embodiments. The gate electrode 144P is over the gate dielectric layer 142P, in accordance with some embodiments. The gate dielectric layer 142P is positioned between the gate electrode 144P and the nanostructure stack 120P, in accordance with some embodiments.

The gate dielectric layer 142P is also positioned between the gate electrode 144P and the fin 114P, in accordance with some embodiments. The gate dielectric layer 142P is positioned between the gate electrode 144P and the isolation layer 130, in accordance with some embodiments.

The gate dielectric layer 142P is made of an oxide-containing material such as silicon oxide, in accordance with some embodiments. The gate dielectric layer 142P is formed using a chemical vapor deposition process and an etching process, in accordance with some embodiments. The gate electrode 144P is made of a semiconductor material such as polysilicon, in accordance with some embodiments. The gate electrode 144P is formed using a chemical vapor deposition process and an etching process, in accordance with some embodiments.

The mask layer 150 is positioned over the gate stacks 140N and 140P, in accordance with some embodiments. The mask layer 150 is made of a different material than the gate stacks 140N and 140P, in accordance with some embodiments. The mask layer 150 is made of nitrides (e.g., silicon nitride) or oxynitride (e.g., silicon oxynitride), in accordance with some embodiments.

As shown in FIGS. 1A and 1A-1, a spacer structure 160 is formed over sidewalls 142a, 144a and 152 of the gate dielectric layer 142N, the gate electrode 144N and the mask layer 150 thereover and sidewalls 142b, 144b and 152 of the gate dielectric layer 142P, the gate electrode 144P and the mask layer 150 thereover, in accordance with some embodiments.

The spacer structure 160 surrounds the gate stacks 140N and 140P and the mask layer 150, in accordance with some embodiments. The spacer structure 160 is positioned over the nanostructure stacks 120N and 120P, the fins 114N and 114P and the isolation layer 130, in accordance with some embodiments.

The spacer structure 160 includes insulating materials, such as silicon oxide, silicon nitride, silicon oxynitride, or silicon carbide, in accordance with some embodiments. The spacer structure 160 is made of a material different from that of the gate stacks 140N and 140P and the mask layer 150, in accordance with some embodiments. The formation of the spacer structure 160 includes deposition processes and an anisotropic etching process, in accordance with some embodiments.

Figure 1B:
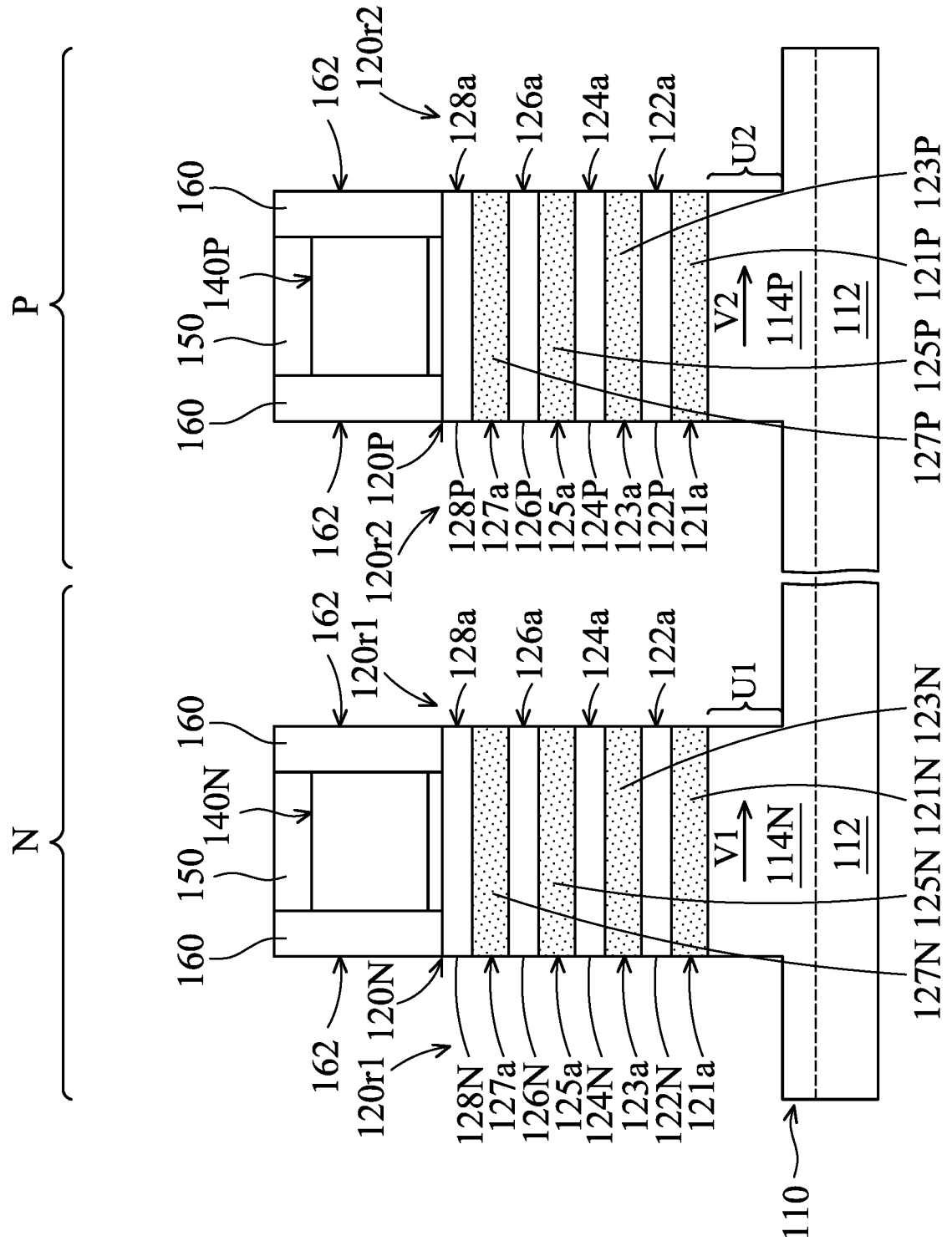

As shown in FIG. 1B, end portions of the nanostructures 121N, 121P, 122N, 122P, 123N, 123P, 124N, 124P, 125N, 125P, 126N, 126P, 127N, 127P, 128N and 128P, which are not covered by the gate stacks 140N and 140P and the spacer structure 160, are removed, in accordance with some embodiments. The removal process forms trenches 120r1 and 120r2 in the nanostructure stacks 120N and 120P respectively, in accordance with some embodiments. The trenches 120r1 and 120r2 respectively extend into the fins 114N and 114P thereunder, in accordance with some embodiments.

As shown in FIG. 1B, sidewalls 121a, 122a, 123a, 124a, 125a, 126a, 127a and 128a of the nanostructures 121N, 122N, 123N, 124N, 125N, 126N, 127N and 128N are substantially aligned with (or substantially coplanar with) sidewalls 162 of the spacer structure 160 over the nanostructure stack 120N, in accordance with some embodiments.

As shown in FIG. 1B, sidewalls 121a, 122a, 123a, 124a, 125a, 126a, 127a and 128a of the nanostructures 121P, 122P, 123P, 124P, 125P, 126P, 127P and 128P are substantially aligned with (or substantially coplanar with) sidewalls 162 of the spacer structure 160 over the nanostructure stack 120P, in accordance with some embodiments.

As shown in FIG. 1B, upper portions U1 and U2 of the fins 114N and 114P are remained under the gate stacks 140N and 140P and the spacer structure 160 after the removal process, in accordance with some embodiments. The upper portions U1 and U2 are also referred to as channel portions, in accordance with some embodiments. The upper portion U1 has the channel direction V1, in accordance with some embodiments. The upper portion U2 has the channel direction V2, in accordance with some embodiments.

The removal process includes an etching process, in accordance with some embodiments. The etching process includes an anisotropic etching process such as a dry etching process, in accordance with some embodiments.

Figure 1C:
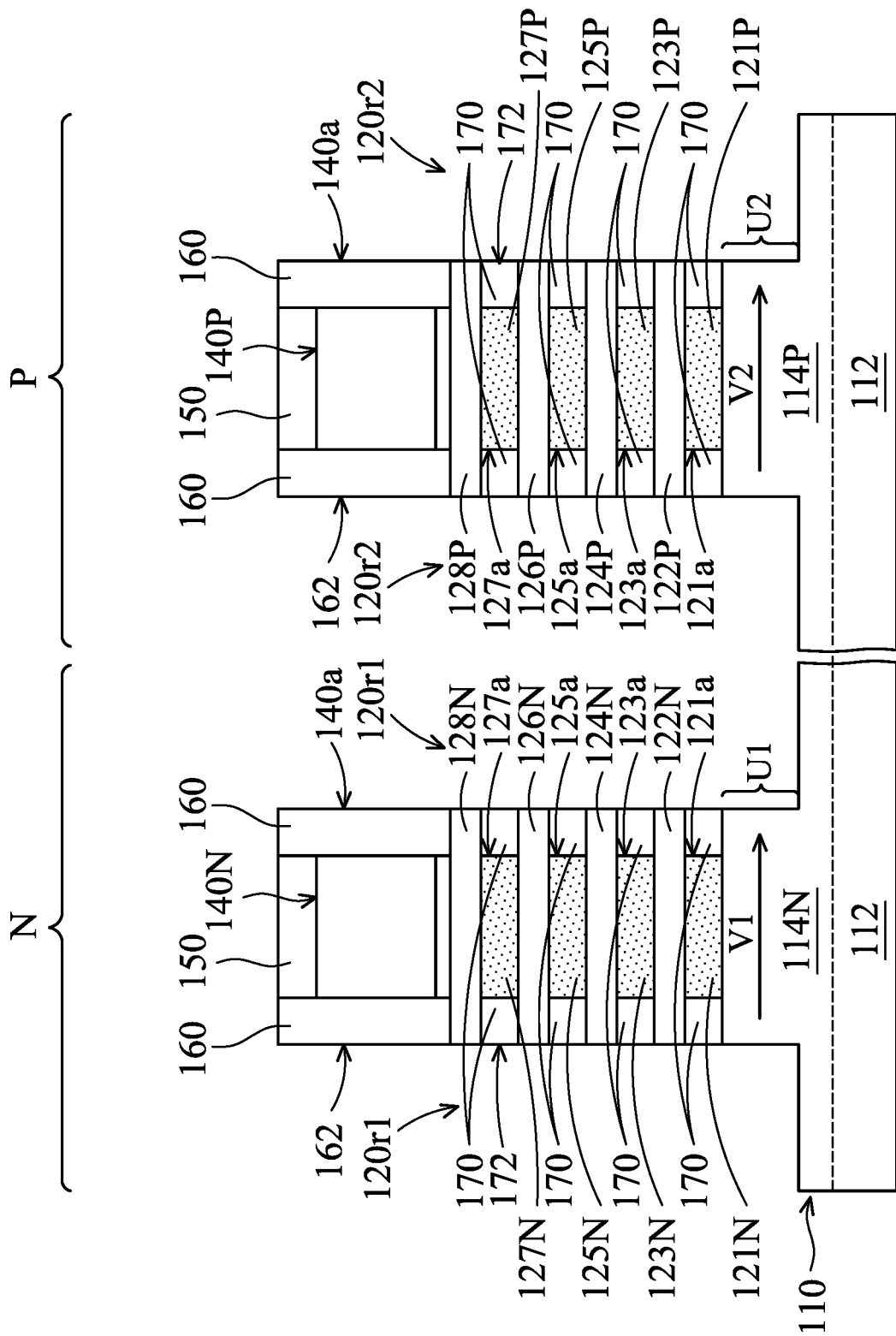

As shown in FIG. 1C, portions of the nanostructures 121N, 121P, 123N, 123P, 125N, 125P, 127N and 127P are removed through the trenches 120r1 and 120r2, in accordance with some embodiments. The removal process includes an etching process such as a dry etching process or a wet etching process, in accordance with some embodiments.

As shown in FIG. 1C, an inner spacer layer 170 is formed over the sidewalls 121a, 123a, 125a and 127a of the nanostructures 121N, 121P, 123N, 123P, 125N, 125P, 127N and 127P, in accordance with some embodiments. The inner spacer layer 170 is in direct contact with the sidewalls 121a, 123a, 125a and 127a, in accordance with some embodiments. As shown in FIG. 1C, sidewalls 172 of the inner spacer layer 170 are substantially aligned with (or substantially coplanar with) the sidewalls 162 of the spacer structure 160, in accordance with some embodiments.

The inner spacer layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments.

In some embodiments, the inner spacer layer 170 is formed using a deposition process and an etching process. The deposition process includes a physical vapor deposition process, a chemical vapor deposition process, an atomic layer deposition process, or the like, in accordance with some embodiments.

In some other embodiments, the inner spacer layer 170 is formed using a selective deposition process such as an atomic layer deposition process. In some still other embodiments, the removal of the portions of the nanostructures 121N, 121P, 123N, 123P, 125N, 125P, 127N and 127P through the trenches 120r1 and 120r2 is not performed, and the inner spacer layer 170 is formed by directly oxidizing the portions of the nanostructures 121N, 121P, 123N, 123P, 125N, 125P, 127N and 127P through the trenches 120r1 and 120r2.

Figure 1D:
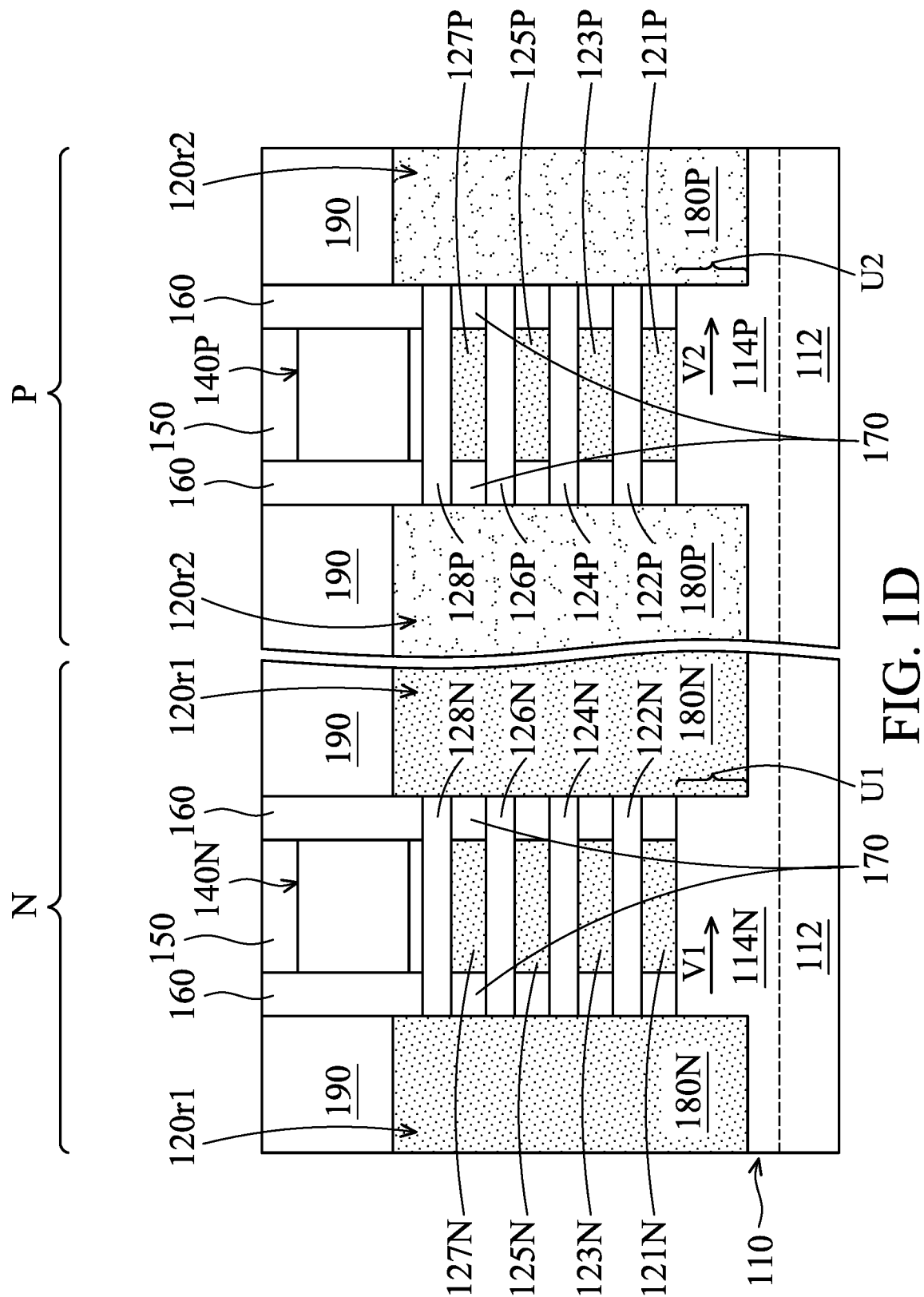

As shown in FIG. 1D, source/drain structures 180N are formed in the trenches 120r1, in accordance with some embodiments. The nanostructures 122N, 124N, 126N and 128N and the upper portion U1 of the fin 114N are between the source/drain structures 180N, in accordance with some embodiments. The source/drain structures 180N are in direct contact with the nanostructures 122N, 124N, 126N and 128N, the spacer structure 160, the inner spacer layer 170, and the substrate 110, in accordance with some embodiments.

In some embodiments, the source/drain structures 180N are made of a semiconductor material and N-type dopants. The semiconductor material of the source/drain structures 180N, the semiconductor material (i.e., the second material) of the nanostructures 122N, 124N, 126N and 128N, and the semiconductor material of the substrate 110 are made of the same semiconductor material, in accordance with some embodiments.

The lattice constant of the source/drain structures 180N and the lattice constant of the nanostructures 122N, 124N, 126N and 128N are substantially equal to each other, in accordance with some embodiments. The term "substantially equal to" means "within about 0.5%", in accordance with some embodiments.

For example, the term "substantially equal to" means the lattice constant difference between the source/drain structures 180N and the nanostructures 122N, 124N, 126N and 128N is within about 0.5% of the average of the lattice constants of the source/drain structures 180N and the nanostructures 122N, 124N, 126N and 128N.

That is, the ratio of the lattice constant difference (between the source/drain structures 180N and the nanostructures 122N, 124N, 126N and 128N) to the average (of the lattice constants of the source/drain structures 180N and the nanostructures 122N, 124N, 126N and 128N) ranges from about 0 to about 0.5%, in accordance with some embodiments.

If the aforementioned ratio (of the aforementioned lattice constant difference to the aforementioned average) is greater than 0.5%, dislocations tend to occur and propagate in the source/drain structures 180N adjacent to the nanostructures 122N, 124N, 126N and 128N. The lattice constant difference may be due to that the N-type dopants may slightly change the lattice constant of the source/drain structures 180N.

The lattice constant of the source/drain structures 180N and the lattice constant of the upper portion U1 (of the fin 114N of the substrate 110) are substantially equal to each other, in accordance with some embodiments. The term "substantially equal to" means "within about 0.5%", in accordance with some embodiments.

For example, the term "substantially equal to" means the lattice constant difference between the source/drain structures 180N and the upper portion U1 is within about 0.5% of the average of the lattice constants of the source/drain structures 180N and the upper portion U1.

That is, the ratio of the lattice constant difference (between the source/drain structures 180N and the upper portion U1) to the average (of the lattice constants of the source/drain structures 180N and the upper portion U1) ranges from about 0 to about 0.5%, in accordance with some embodiments.

If the aforementioned ratio (of the aforementioned lattice constant difference to the aforementioned average) is greater than 0.5%, dislocations tend to occur and propagate in the source/drain structures 180N adjacent to the upper portion U1. The lattice constant difference may be due to that the N-type dopants may slightly change the lattice constant of the source/drain structures 180N.

In some embodiments, the lattice constant of the source/drain structures 180N, the lattice constant of the nanostructures 122N, 124N, 126N and 128N, and the lattice constant of the upper portion U1 (of the fin 114N of the substrate 110) are substantially equal to each other, which prevents dislocations from occurring and propagating in the source/drain structures 180N adjacent to the nanostructures 122N, 124N, 126N and 128N and the upper portion U1, in accordance with some embodiments.

The source/drain structures 180N are in-situ doped with or implanted with N-type dopants, in accordance with some embodiments. The N-type dopants include the Group VA element, in accordance with some embodiments. The Group VA element includes phosphor (P), antimony (Sb), or another suitable Group VA material.

In some embodiments, a concentration of the Group VA element ranges from about 1E20 atoms/cm$^3$ to about 5E20 atoms/cm$^3$. In some embodiments, the atomic percentage of the Group VA element in the source/drain structures 180N ranges from about 1% to about 5%. The source/drain structures 180N are also referred to as doped structures, in accordance with some embodiments.

The source/drain structures 180N are formed using an epitaxial process, in accordance with some embodiments. In some embodiments, the trenches 120r2 are covered by a mask layer (not shown) during the formation of the source/drain structures 180N, and the mask layer is removed after the formation of the source/drain structures 180N.

As shown in FIG. 1D, source/drain structures 180P are formed in the trenches 120r2, in accordance with some embodiments. The nanostructures 122P, 124P, 126P and 128P and the upper portion U2 of the fin 114P are between the source/drain structures 180P, in accordance with some embodiments. The source/drain structures 180P are in direct contact with the nanostructures 122P, 124P, 126P and 128P, the spacer structure 160, the inner spacer layer 170, and the substrate 110, in accordance with some embodiments.

In some embodiments, the source/drain structures 180P are made of a semiconductor material and P-type dopants. The semiconductor material of the source/drain structures 180P, the semiconductor material (i.e., the second material) of the nanostructures 122P, 124P, 126P and 128P, and the semiconductor material of the substrate 110 are made of the same semiconductor material, in accordance with some embodiments.

The lattice constant of the source/drain structures 180P and the lattice constant of the nanostructures 122P, 124P, 126P and 128P are substantially equal to each other, in accordance with some embodiments. The term "substantially equal to" means "within about 0.5%", in accordance with some embodiments.

For example, the term "substantially equal to" means the lattice constant difference between the source/drain structures 180P and the nanostructures 122P, 124P, 126P and 128P is within about 0.5% of the average of the lattice constants of the source/drain structures 180P and the nanostructures 122P, 124P, 126P and 128P.

That is, the ratio of the lattice constant difference (between the source/drain structures 180P and the nanostructures 122P, 124P, 126P and 128P) to the average (of the lattice constants of the source/drain structures 180P and the nanostructures 122P, 124P, 126P and 128P) ranges from about 0 to about 0.5%, in accordance with some embodiments.

If the aforementioned ratio (of the aforementioned lattice constant difference to the aforementioned average) is greater than 0.5%, dislocations tend to occur and propagate in the source/drain structures 180P adjacent to the nanostructures 122P, 124P, 126P and 128P. The lattice constant difference may be due to that the P-type dopants may slightly change the lattice constant of the source/drain structures 180P.

The lattice constant of the source/drain structures 180P and the lattice constant of the upper portion U2 (of the fin 114P of the substrate 110) are substantially equal to each other, in accordance with some embodiments. The term "substantially equal to" means "within about 0.5%", in accordance with some embodiments.

For example, the term "substantially equal to" means the lattice constant difference between the source/drain structures 180P and the upper portion U2 is within about 0.5% of the average of the lattice constants of the source/drain structures 180P and the upper portion U2.

That is, the ratio of the lattice constant difference (between the source/drain structures 180P and the upper portion U2) to the average (of the lattice constants of the source/drain structures 180P and the upper portion U2) ranges from about 0 to about 0.5%, in accordance with some embodiments.

If the aforementioned ratio (of the aforementioned lattice constant difference to the aforementioned average) is greater than 0.5%, dislocations tend to occur and propagate in the source/drain structures 180P adjacent to the upper portion U2. The lattice constant difference may be due to that the P-type dopants may slightly change the lattice constant of the source/drain structures 180P.

In some embodiments, the lattice constant of the source/drain structures 180P, the lattice constant of the nanostructures 122P, 124P, 126P and 128P, and the lattice constant of the upper portion U2 (of the fin 114P of the substrate 110) are substantially equal to each other, which prevents dislocations from occurring and propagating in the source/drain structures 180P adjacent to the nanostructures 122P, 124P, 126P and 128P and the upper portion U2, in accordance with some embodiments.

The source/drain structures 180P are in-situ doped with or implanted with P-type dopants, in accordance with some embodiments. The P-type dopants include the Group IIIA element, in accordance with some embodiments. The Group IIIA element includes boron or another suitable material.

In some embodiments, a concentration of the Group IIIA element ranges from about 1E20 atoms/cm$^3$ to about 5E20 atoms/cm$^3$. In some embodiments, the atomic percentage of the Group IIIA element in the source/drain structures 180P ranges from about 1% to about 5%. The source/drain structures 180P are also referred to as doped structures, in accordance with some embodiments.

The source/drain structures 180P are formed using an epitaxial process, in accordance with some embodiments. In some embodiments, the source/drain structures 180N are covered by a mask layer (not shown) during the formation of the source/drain structures 180P, and the mask layer is removed after the formation of the source/drain structures 180P.

As shown in FIG. 1D, a dielectric layer 190 is formed over the source/drain structures 180N, the source/drain structures 180P, and the isolation layer 130 (as shown in FIG. 1A-1), in accordance with some embodiments. The dielectric layer 190 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 190 is formed by a deposition process (e.g., a chemical vapor deposition process) and a planarization process (e.g., a chemical mechanical polishing process), in accordance with some embodiments.

Figure 1E:
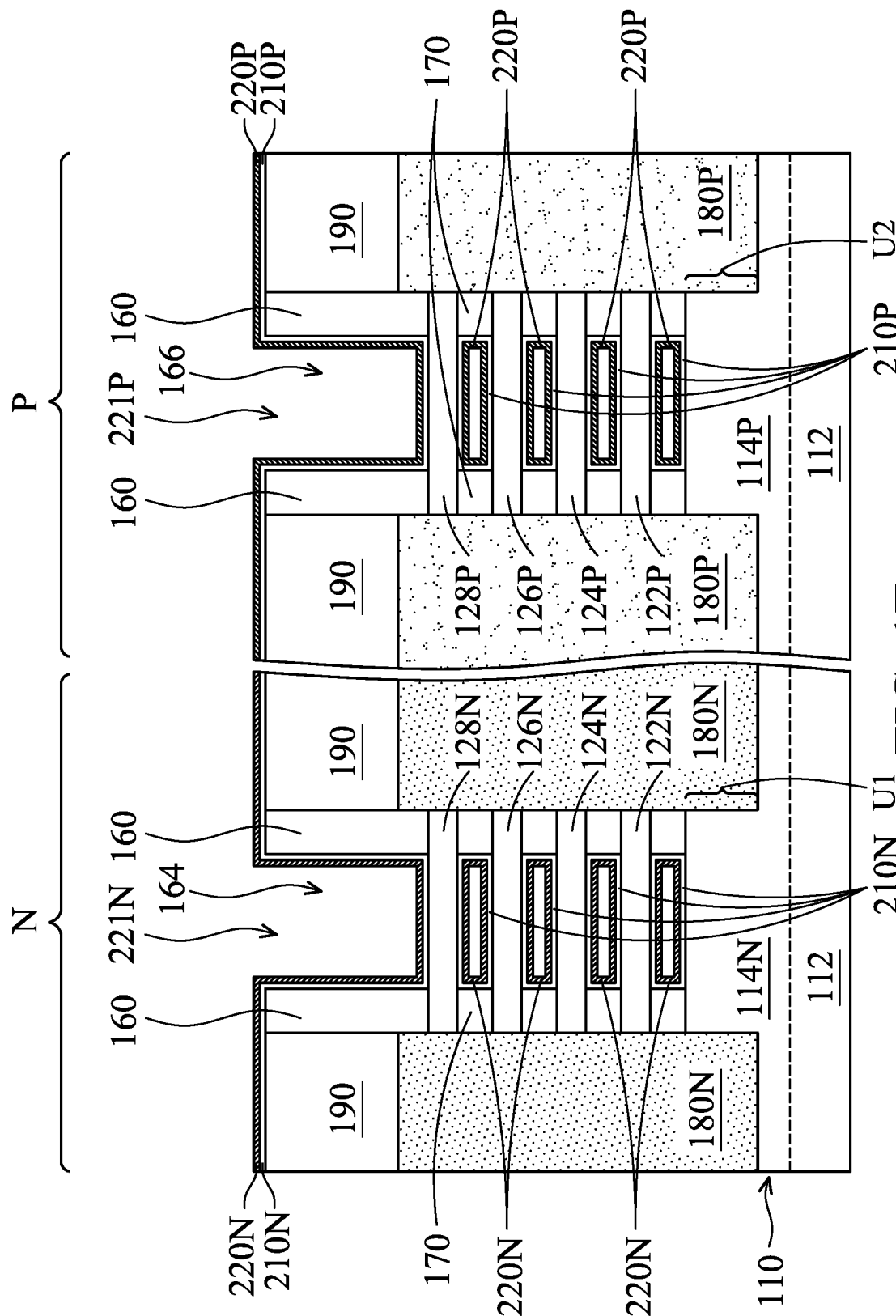

As shown in FIGS. 1D and 1E, the gate stacks 140N and 140P and the mask layer 150 are removed, in accordance with some embodiments. The removal process forms trenches 164 and 166 in the spacer structure 160, in accordance with some embodiments. As shown in FIGS. 1D and 1E, the nanostructures 121N, 121P, 123N, 123P, 125N, 125P, 127N and 127P are removed through the trenches 164 and 166, in accordance with some embodiments. The removal process for removing the gate stacks 140N and 140P, the mask layer 150 and the nanostructures 121N, 121P, 123N, 123P, 125N, 125P, 127N and 127P includes an etching process such as a wet etching process or a dry etching process, in accordance with some embodiments.

As shown in FIG. 1E, a gate dielectric layer 210N is formed over the nanostructures 122N, 124N, 126N, and 128N, the fin 114N, the spacer structure 160, the inner spacer layer 170 and the dielectric layer 190, in accordance with some embodiments. The gate dielectric layer 210N conformally covers the nanostructures 122N, 124N, 126N, and 128N, the fin 114N, the spacer structure 160, the inner spacer layer 170 and the dielectric layer 190, in accordance with some embodiments. The gate dielectric layer 210N surrounds the nanostructures 122N, 124N, 126N, and 128N, in accordance with some embodiments.

As shown in FIG. 1E, a gate dielectric layer 210P is formed over the nanostructures 122P, 124P, 126P and 128P, the fin 114P, the spacer structure 160, the inner spacer layer 170 and the dielectric layer 190, in accordance with some embodiments. The gate dielectric layer 210P conformally covers the nanostructures 122P, 124P, 126P and 128P, the fin 114P, the spacer structure 160, the inner spacer layer 170 and the dielectric layer 190, in accordance with some embodiments. The gate dielectric layer 210P surrounds the nanostructures 122P, 124P, 126P, and 128P, in accordance with some embodiments.

The gate dielectric layer 210N or 210P is made of a high-K material, such as $HfO_2$, $La_2O_3$, $CaO$, $ZrO_2$, $HfZrO_2$, or $Al_2O_3$, in accordance with some embodiments. The gate dielectric layer 210N or 210P is formed using an atomic layer deposition process or another suitable process.

As shown in FIG. 1E, a work function metal layer 220N is conformally formed over the gate dielectric layer 210N in the N-region N, in accordance with some embodiments. The work function metal layer 220N provides a desired work function for transistors to enhance device performance including improved threshold voltage. In the embodiments of forming an NMOS transistor, the work function metal layer 220N can be a metal capable of providing a work function value suitable for the device, such as equal to or less than about 4.5 eV.

The work function metal layer 220N is made of metal, metal carbide, metal nitride, or a combination thereof, in accordance with some embodiments. For example, the work function metal layer 220N is made of tantalum, hafnium carbide, zirconium carbide, tantalum nitride, or a combination thereof.

The work function metal layer 220N is formed using a deposition process, a photolithography process, and an etching process, in accordance with some embodiments. The deposition process includes a physical vapor deposition process, a chemical vapor deposition process, an atomic layer deposition process, or a combination thereof, in accordance with some embodiments.

As shown in FIG. 1E, a work function metal layer 220P is conformally formed over the gate dielectric layer 210P in the P-region P, in accordance with some embodiments. The work function metal layer 220P provides a desired work function for transistors to enhance device performance including improved threshold voltage. In the embodiments of forming a PMOS transistor, the work function metal layer 220P can be a metal capable of providing a work function value suitable for the device, such as equal to or greater than about 4.8 eV.

The work function metal layer 220P is made of metal, metal carbide, metal nitride, another suitable material, or a combination thereof, in accordance with some embodiments. For example, the work function metal layer 220P is made of titanium, titanium nitride, another suitable material, or a combination thereof.

The work function metal layer 220P is formed using a deposition process, a photolithography process, and an etching process, in accordance with some embodiments. The deposition process includes a physical vapor deposition process, a chemical vapor deposition process, an atomic layer deposition process, or a combination thereof, in accordance with some embodiments.

Figure 1F:
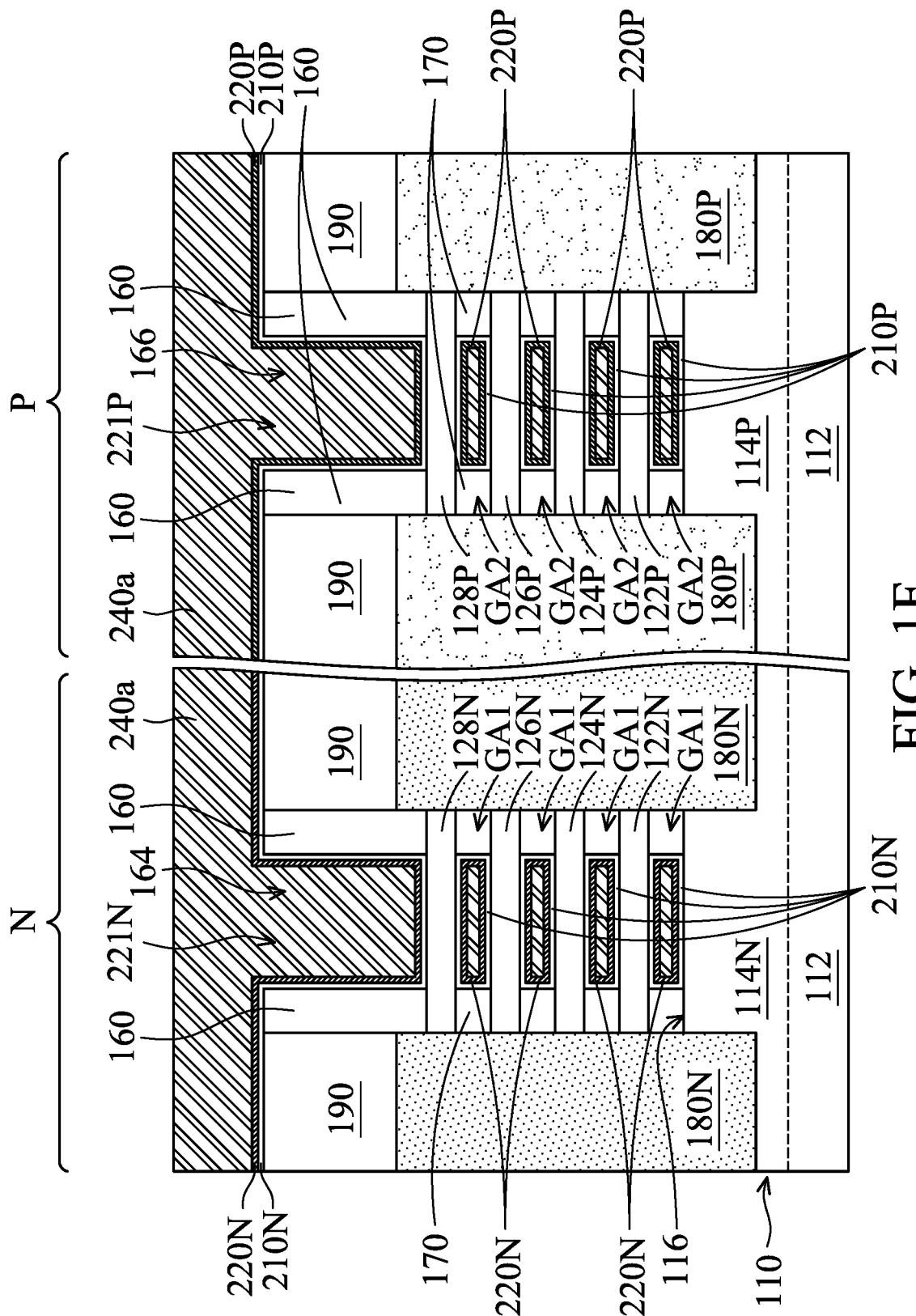

As shown in FIG. 1F, a gate electrode material layer 240*a* is formed over the work function metal layers 220N and 220P, in accordance with some embodiments. The trenches 164 and 166 of the spacer structure 160 (or the recesses 221N and 221P of the work function metal layers 220N and 220P), gaps GA1 between the fin 114N and the nanostructures 122N, 124N, 126N, and 128N, and gaps GA2 between the fin 114P and the nanostructures 122P, 124P, 126P, and 128P are completely filled with the gate electrode material layer 240*a*, in accordance with some embodiments.

The gate electrode material layer 240*a* is made of metal, metal nitride, or metal carbide, in accordance with some embodiments. The gate electrode material layer 240*a* is made of tungsten, titanium nitride, tantalum nitride, titanium aluminide, titanium carbide, or a combination thereof, in accordance with some embodiments. The gate electrode material layer 240a is formed using an atomic layer deposition process, a chemical vapor deposition process, or a physical vapor deposition process, in accordance with some embodiments.

Figure 1G:
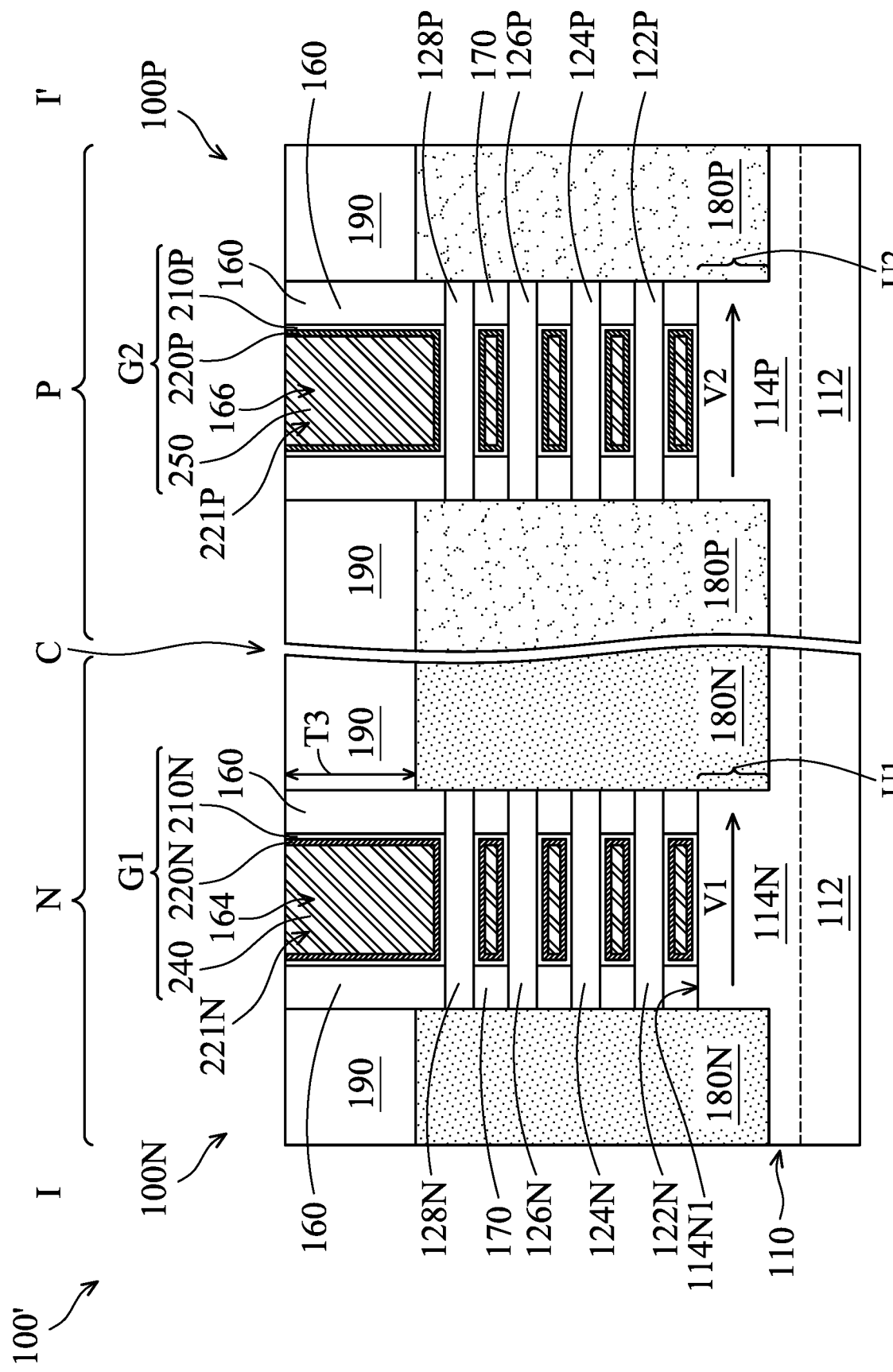
Figures 1, 1G:
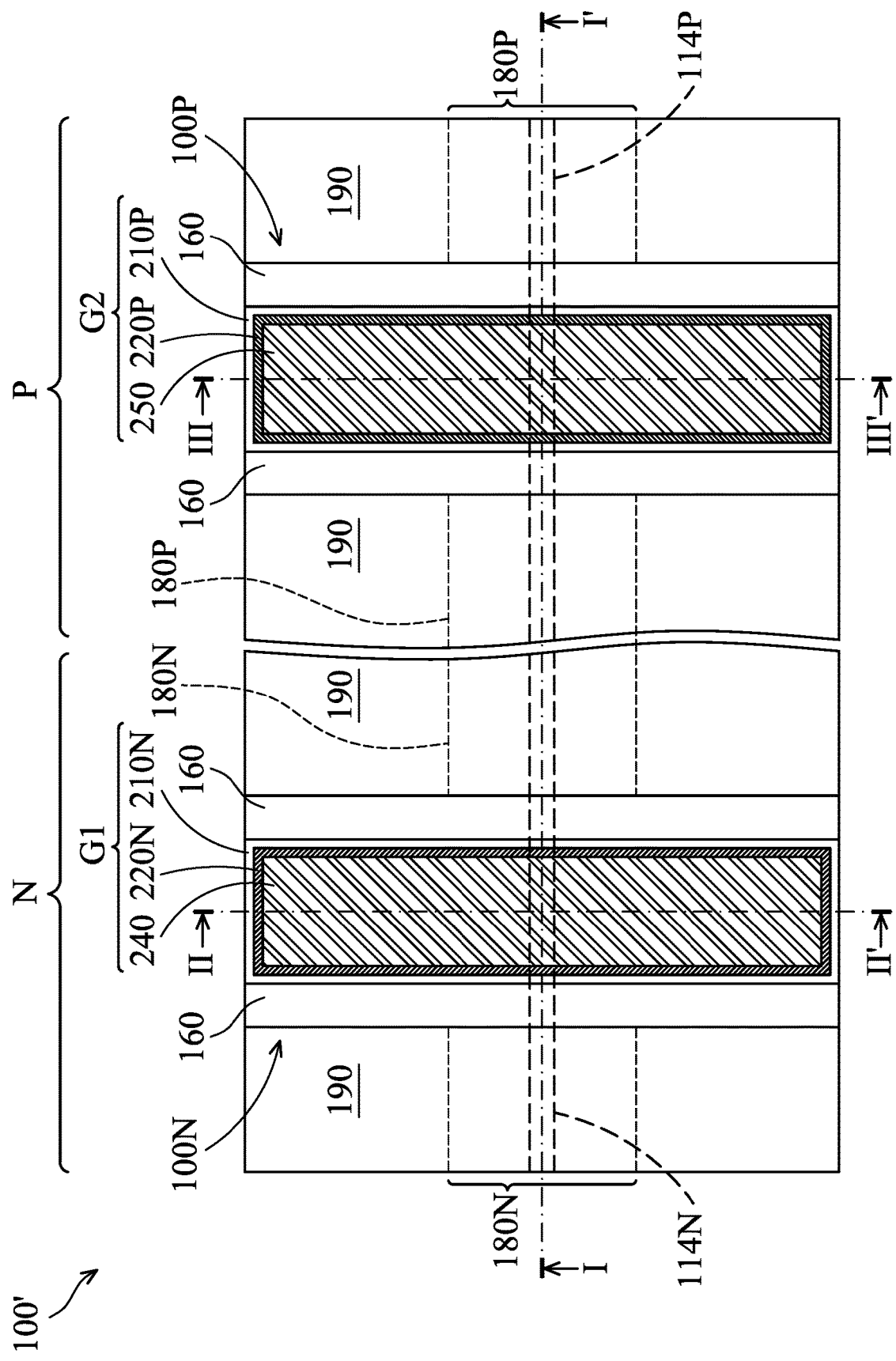
Figures 1, 1G, 2:
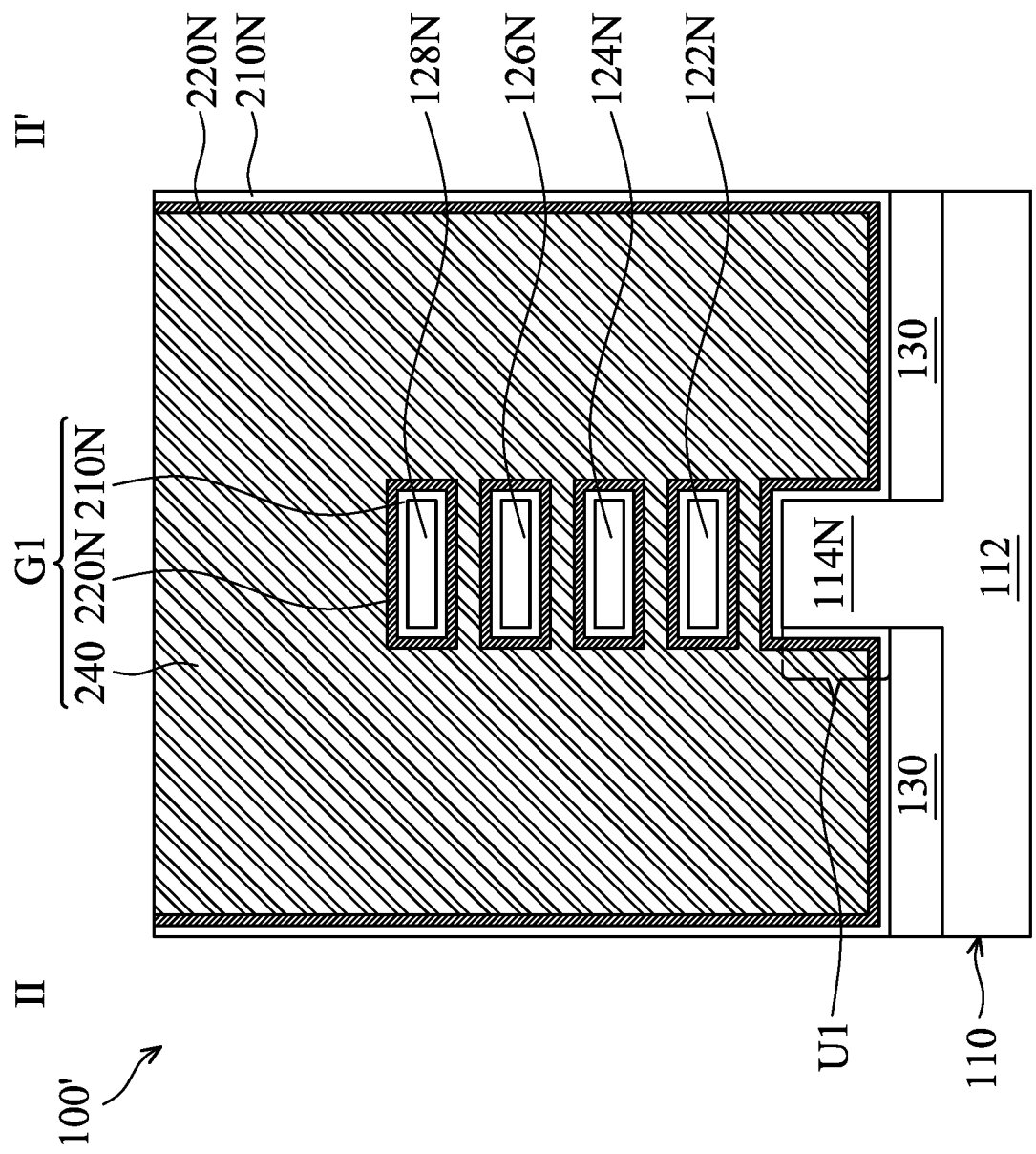
Figures 1, 1G, 2, 3:
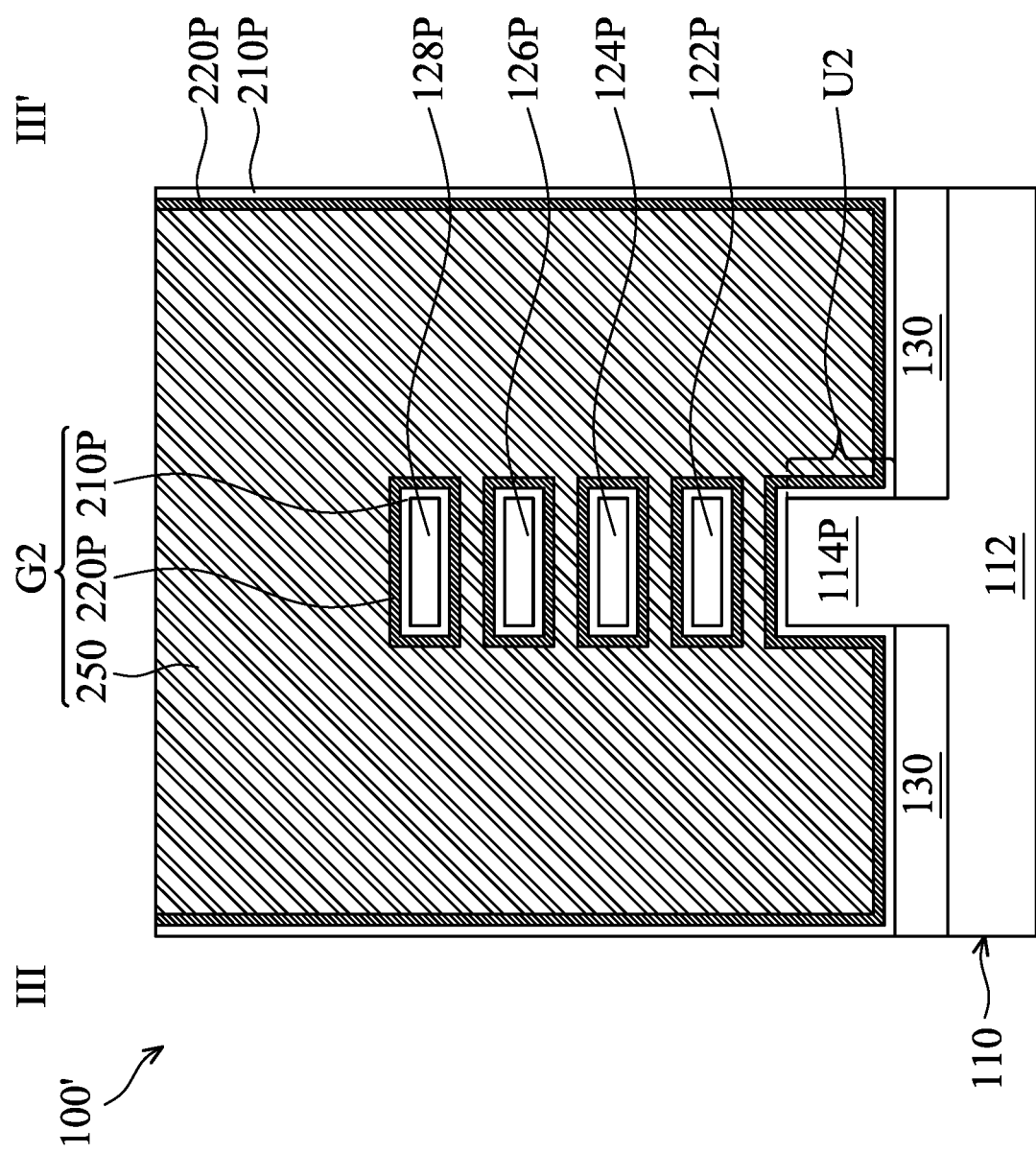

FIG. 1G-1 is a top view of the semiconductor device structure of FIG. 1G, in accordance with some embodiments. FIG. 1G is a cross-sectional view illustrating the semiconductor device structure along a sectional line I-I' in FIG. 1G-1, in accordance with some embodiments. FIG. 1G-2 is a cross-sectional view illustrating the semiconductor device structure along a sectional line II-IF in FIG. 1G-1, in accordance with some embodiments. FIG. 1G-3 is a cross-sectional view illustrating the semiconductor device structure along a sectional line III-III' in FIG. 1G-1, in accordance with some embodiments.

As shown in FIGS. 1G, 1G-1, 1G-2, and 1G-3, the gate electrode material layer 240a outside of the trenches 164 and 166 are removed, in accordance with some embodiments. In this step, a semiconductor device structure 100' is formed, in accordance with some embodiments. The gate electrode material layer 240a remaining in the trench 164 forms a gate electrode layer 240, in accordance with some embodiments.

The gate electrode layer 240 surrounds the nanostructures 122N, 124N, 126N, and 128N, in accordance with some embodiments. The gate electrode layer 240, the work function metal layer 220N, and the gate dielectric layer 210N thereunder together form a gate stack G1, in accordance with some embodiments.

The gate electrode material layer 240a remaining in the trench 166 forms a gate electrode layer 250, in accordance with some embodiments. The gate electrode layer 250 surrounds the nanostructures 122P, 124P, 126P, and 128P, in accordance with some embodiments. The gate electrode layer 250, the work function metal layer 220P, and the gate dielectric layer 210P thereunder together form a gate stack G2, in accordance with some embodiments. The removal process includes a planarization process such as a chemical mechanical polishing process, in accordance with some embodiments.

In this step, an NMOS transistor 100N and a PMOS transistor 100P are substantially formed, in accordance with some embodiments. The NMOS transistor 100N and the PMOS transistor 100P are gate-all-around (GAA) transistors, in accordance with some embodiments. The NMOS transistor 100N and the PMOS transistor 100P together form a complementary metal-oxide-semiconductor (CMOS) transistor C, in accordance with some embodiments.

The NMOS transistor 100N includes the gate stack G1, the nanostructures 122N, 124N, 126N, and 128N, the upper portion U1 of the fin 114N, and the source/drain structures 180N, in accordance with some embodiments. The nanostructures 122N, 124N, 126N, and 128N and the upper portion U1 of the fin 114N are channels of the NMOS transistor 100N, in accordance with some embodiments.

The PMOS transistor 100P includes the gate stack G2, the nanostructures 122P, 124P, 126P and 128P, the upper portion U2 of the fin 114P, and the source/drain structures 180P, in accordance with some embodiments. The nanostructures 122P, 124P, 126P and 128P and the upper portion U2 of the fin 114P are channels of the PMOS transistor 100P, in accordance with some embodiments.

The carrier velocity in the channel direction V1 (i.e., [1 0 0], [−1 0 0], [0 1 0], or [0 −1 0]) is higher than the carrier velocity in the [1 1 0] channel direction, in accordance with some embodiments. Since the carrier velocity in the channel direction V1 is high, a driving current (On current; $I_{on}$) during voltage application is high, in accordance with some embodiments.

Therefore, the nanostructures 122N, 124N, 126N, and 128N and the upper portion U1 having the channel direction V1 improve the driving current ($I_{on}$) of the NMOS transistor 100N, which improves the performance of the NMOS transistor 100N, in accordance with some embodiments.

Similarly, the nanostructures 122P, 124P, 126P, and 128P and the upper portion U2 having the channel direction V2 improve the driving current (I on) of the PMOS transistor 100P, which improves the performance of the PMOS transistor 100P, in accordance with some embodiments.

The semiconductor material of the source/drain structures 180N, the semiconductor material of the nanostructures 122N, 124N, 126N and 128N, and the semiconductor material of the substrate 110 are made of the same semiconductor material, which reduces the conduction band offset between the source/drain structures 180N and the nanostructures 122N, 124N, 126N and 128N and between the source/drain structures 180N and the upper portion U1 of the substrate 110.

Therefore, the resistance between the source/drain structures 180N and the nanostructures 122N, 124N, 126N and 128N and between the source/drain structures 180N and the upper portion U1 of the substrate 110 is reduced, which improves the driving current ($I_{on}$) of the NMOS transistor 100N. Therefore, the performance of the NMOS transistor 100N is improved, in accordance with some embodiments.

The semiconductor material of the source/drain structures 180P, the semiconductor material of the nanostructures 122P, 124P, 126P and 128P, and the semiconductor material of the substrate 110 are made of the same semiconductor material, which reduces the valence band offset between the source/drain structures 180P and the nanostructures 122P, 124P, 126P and 128P and between the source/drain structures 180P and the upper portion U2 of the substrate 110.

Therefore, the resistance between the source/drain structures 180P and the nanostructures 122P, 124P, 126P and 128P and between the source/drain structures 180P and the upper portion U2 of the substrate 110 is reduced, which improves the driving current (I on) of the PMOS transistor 100P. Therefore, the performance of the PMOS transistor 100P is improved, in accordance with some embodiments. The NMOS transistor 100N and the PMOS transistor 100P may be used in a high performance chip, such as a high performance computing (HPC) chip.

Since the channel direction V2 is not sensitive to stress, the source/drain structures 180P have no need to provide a stress to the channels of the PMOS transistor 100P. Therefore, the source/drain structures 180P are able to be made of silicon in place of silicon germanium, in accordance with some embodiments. Since silicon is cheaper than silicon germanium, the cost of the PMOS transistor 100P is reduced, in accordance with some embodiments.

Figure 1H:
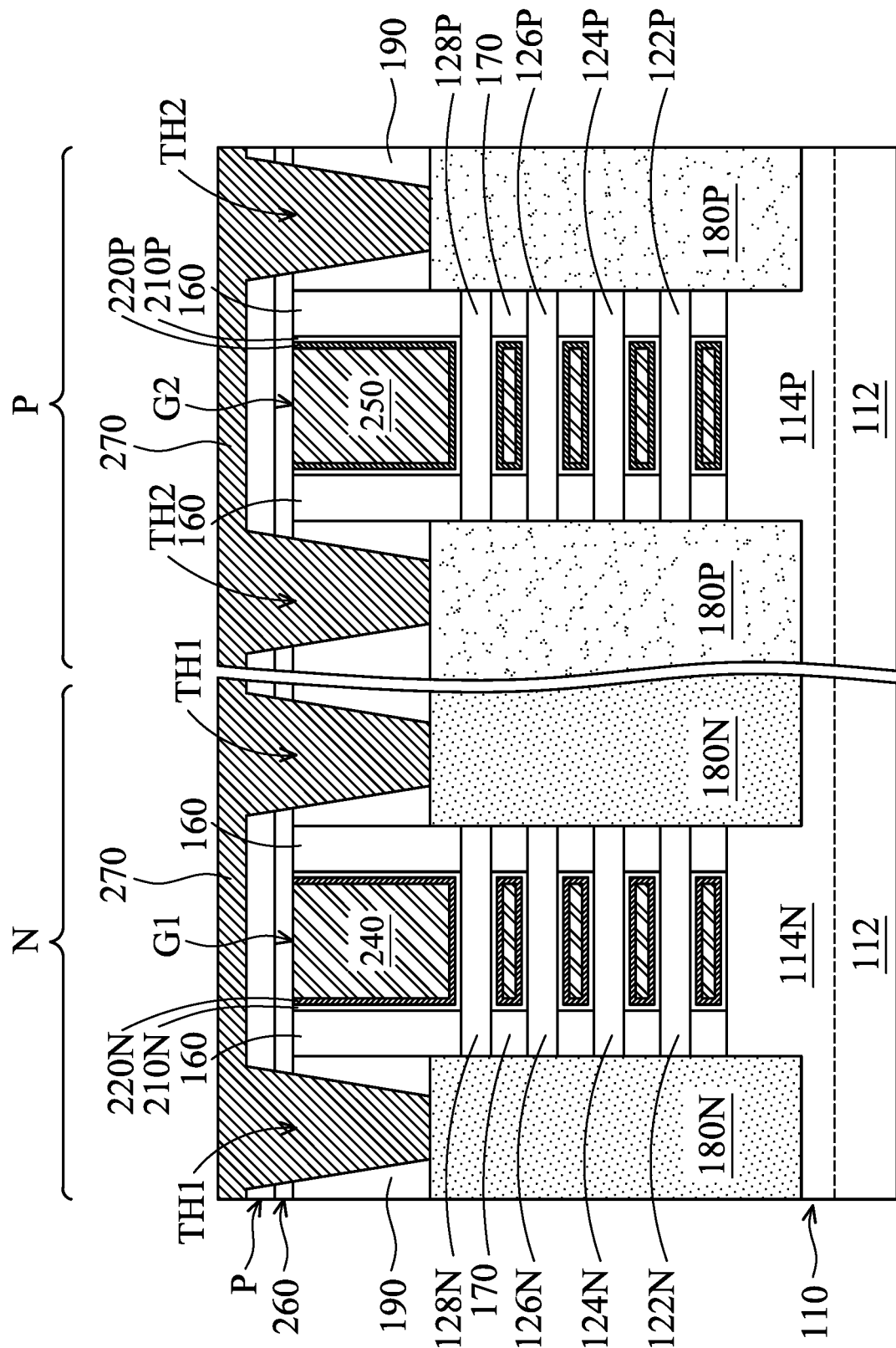

As shown in FIG. 1H, an etching stop layer 260 (also called an insulating layer or a dielectric layer) is deposited over the top surfaces of the dielectric layer 190, the spacer structure 160, and the gate stacks G1 and G2, in accordance with some embodiments. The etching stop layer 260 is made of silicon nitride, in accordance with some embodiments. As shown in FIG. 1H, a protective layer P is formed over the etching stop layer 260, in accordance with some embodiments. The protective layer P includes a plasma-enhanced oxide (PEOX) layer, in accordance with some embodiments.

As shown in FIG. 1H, portions of the protective layer P, the etching stop layer 260, and the dielectric layer 190 are removed to form through holes TH1 and TH2, in accordance with some embodiments. The through holes TH1 and TH2 pass through the protective layer P, the etching stop layer 260, and the dielectric layer 190 to expose the source/drain structures 180N and the source/drain structures 180P respectively, in accordance with some embodiments. The removal process includes performing a photolithography process and an etching process, in accordance with some embodiments.

As shown in FIG. 1H, a contact material layer 270 is deposited over the protective layer P and is filled into the through holes TH1 and TH2 to electrically contact with the source/drain structures 180N and the source/drain structures 180P, in accordance with some embodiments. The contact material layer 270 is formed by, for example, a PVD process or another suitable process. The contact material layer 270 is made of, for example, tungsten or another suitable conductive material.

Figure 1I:
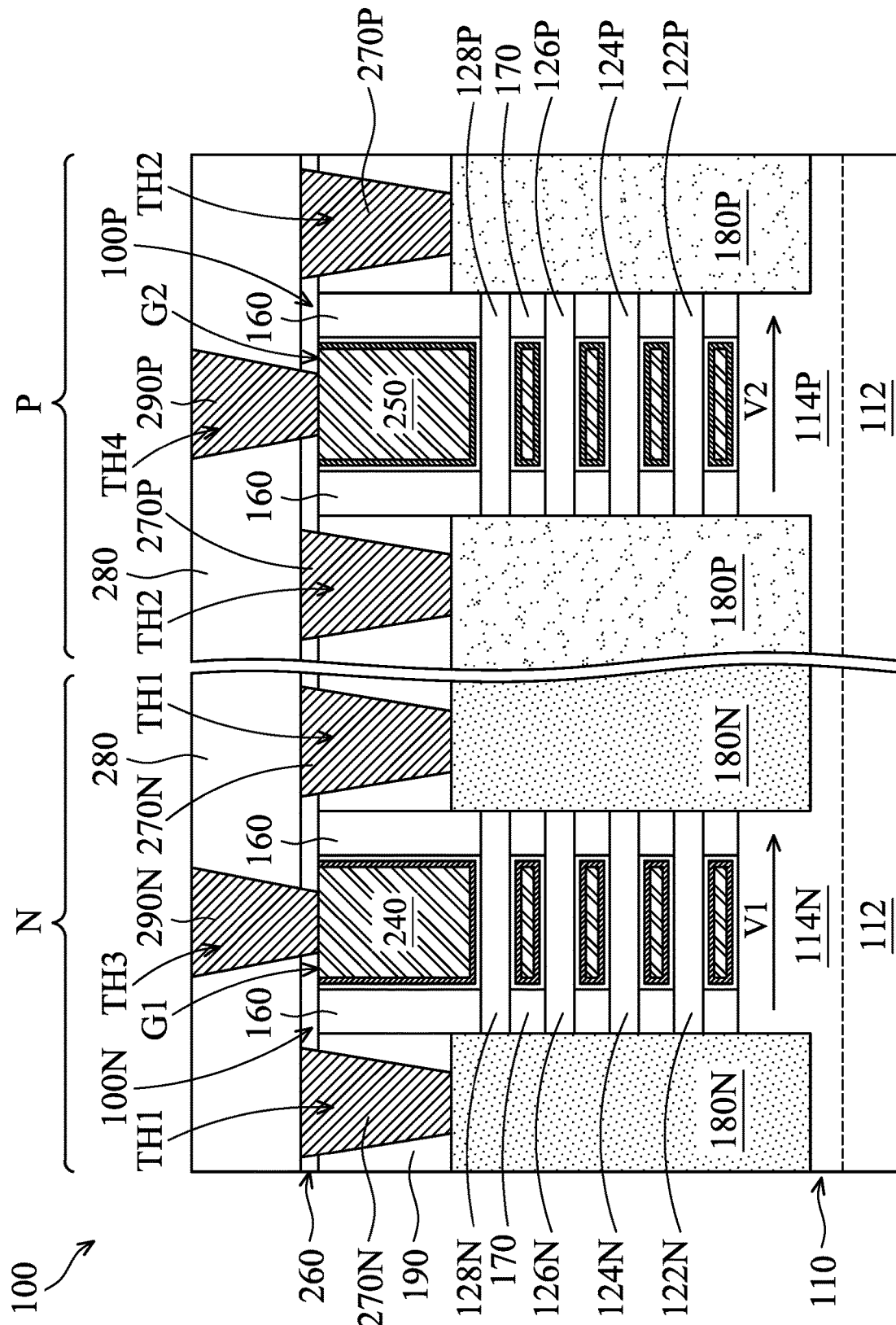

As shown in FIG. 1I, a planarization process is performed to remove the contact material layer 270 outside the through holes TH1 and TH2 and the protective layer P, in accordance with some embodiments. In this step, a semiconductor device structure 100 is substantially formed, in accordance with some embodiments. The planarization process includes a chemical mechanical polishing (CMP) process, in accordance with some embodiments.

After the CMP process, the contact material layer 270 remaining in the through holes TH1 forms contact structures 270N, in accordance with some embodiments. The contact structures 270N are electrically connected to the source/drain structures 180N respectively, in accordance with some embodiments. The contact structures 270N include contact plugs, in accordance with some embodiments.

After the CMP process, the contact material layer 270 remaining in the through holes TH2 forms contact structures 270P, in accordance with some embodiments. The contact structures 270P are electrically connected to the source/drain structures 180P respectively, in accordance with some embodiments. The contact structures 270P include contact plugs, in accordance with some embodiments.

As shown in FIG. 1I, a dielectric layer 280 is deposited over the etching stop layer 260 and the contact structures 270N and 270P, in accordance with some embodiments. The dielectric layer 280 includes silicon oxide, silicon oxynitride, borosilicate glass, phosphoric silicate glass (PSG), borophosphosilicate glass (BPSG), fluorinated silicate glass (FSG), low-k material, porous dielectric material, or a combination thereof, in accordance with some embodiments. The dielectric layer 280 is deposited using a CVD process, a HDPCVD process, a spin-on process, a sputtering process, or a combination thereof, in accordance with some embodiments.

As shown in FIG. 1I, portions of the etching stop layer 260 and the dielectric layer 280 are removed, in accordance with some embodiments. The removal process forms through holes TH3 and TH4 in the etching stop layer 260 and the dielectric layer 280, in accordance with some embodiments. The through hole TH3 exposes the gate electrode layer 240 of the gate stack G1, in accordance with some embodiments. The through hole TH4 exposes the gate electrode layer 250 of the gate stack G2, in accordance with some embodiments.

As shown in FIG. 1I, contact structures 290N and 290P are formed in the through holes TH3 and TH4 respectively, in accordance with some embodiments. The contact structures 290N and 290P are electrically connected to the gate electrode layer 240 and the gate electrode layer 250 respectively, in accordance with some embodiments.

The contact structure 290N is in direct contact with the gate electrode layer 240, in accordance with some embodiments. The contact structure 290P is in direct contact with the gate electrode layer 250, in accordance with some embodiments. The contact structures 290N and 290P are made of, for example, tungsten or another suitable conductive material.

Figure 2A:
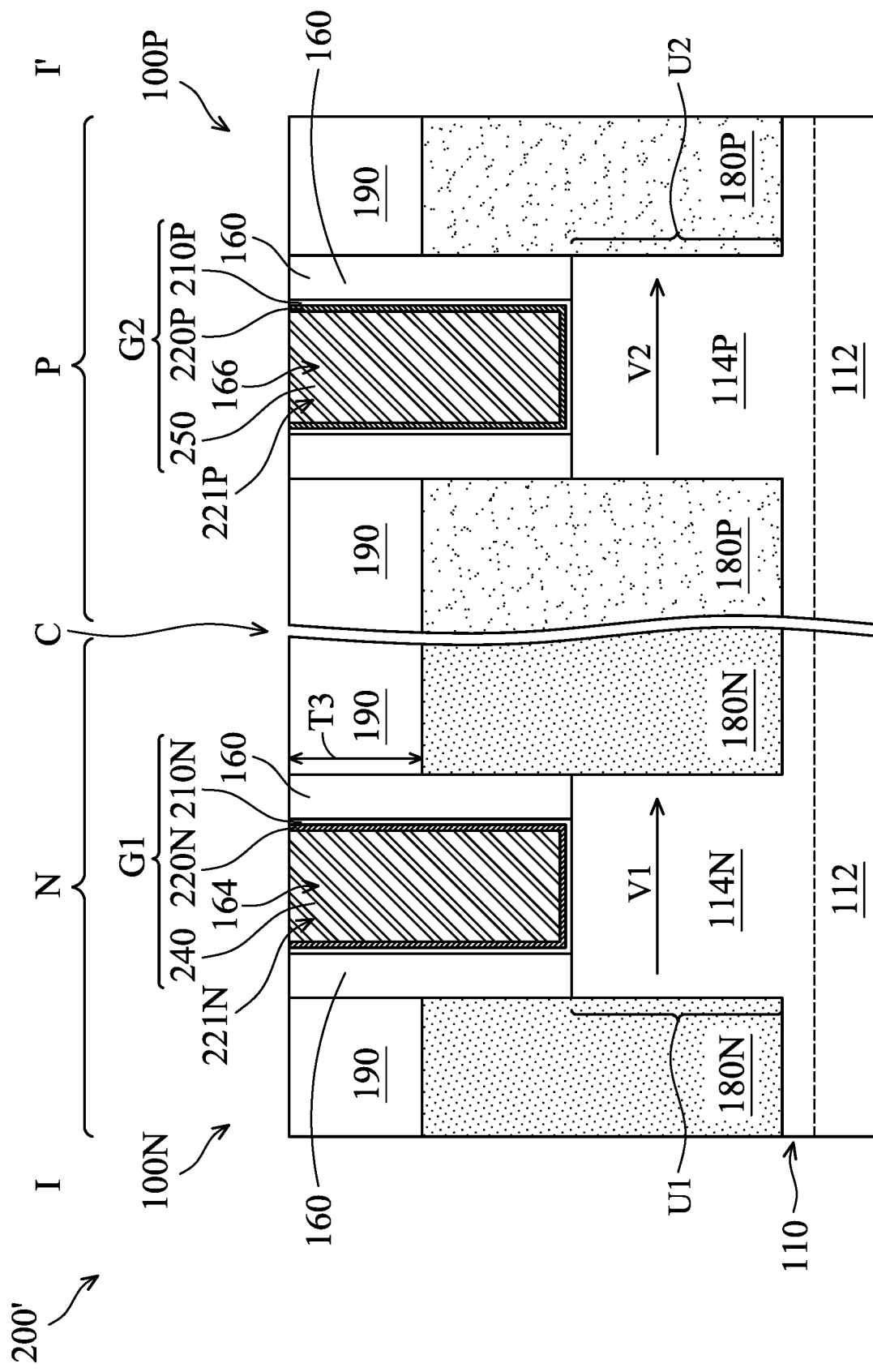
FIG. 2A is a cross-sectional view illustrating a semiconductor device structure, in accordance with some embodiments.
Figure 2B:
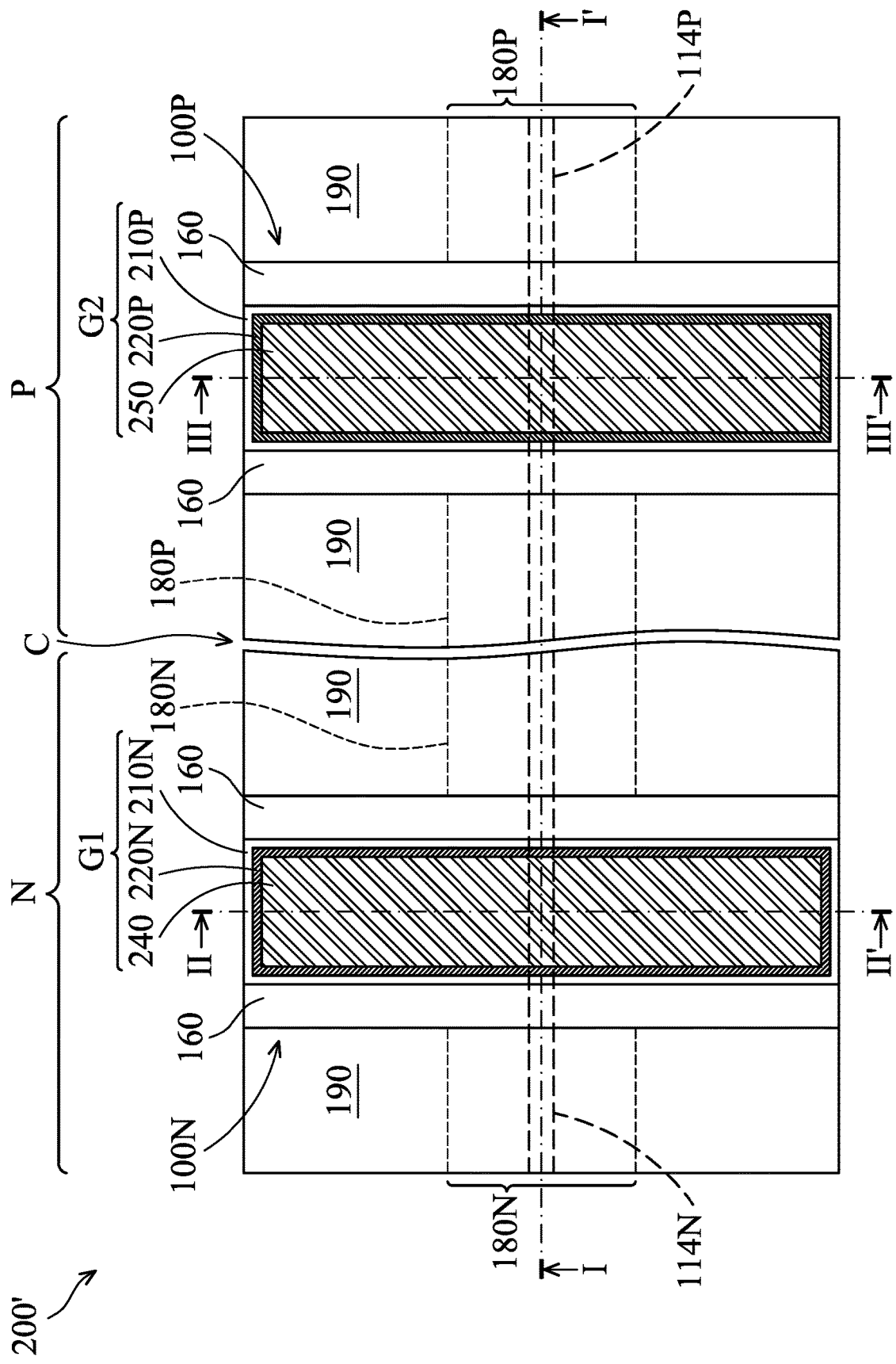
FIG. 2B is a top view of the semiconductor device structure of FIG. 2A, in accordance with some embodiments.
Figure 2C:
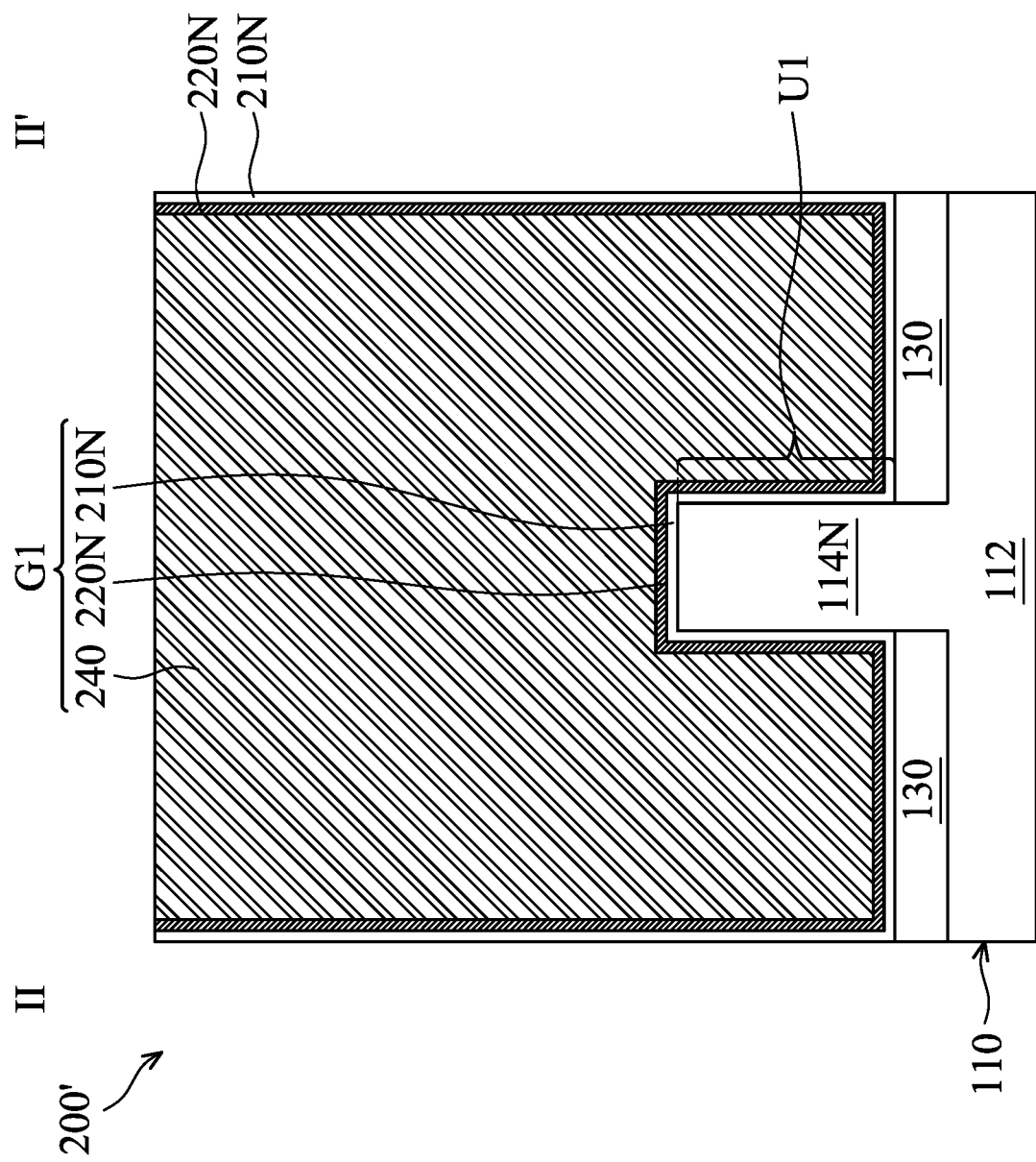
FIG. 2C is a cross-sectional view illustrating the semiconductor device structure along a sectional line II-IF in FIG. 2B, in accordance with some embodiments.
Figure 2D:
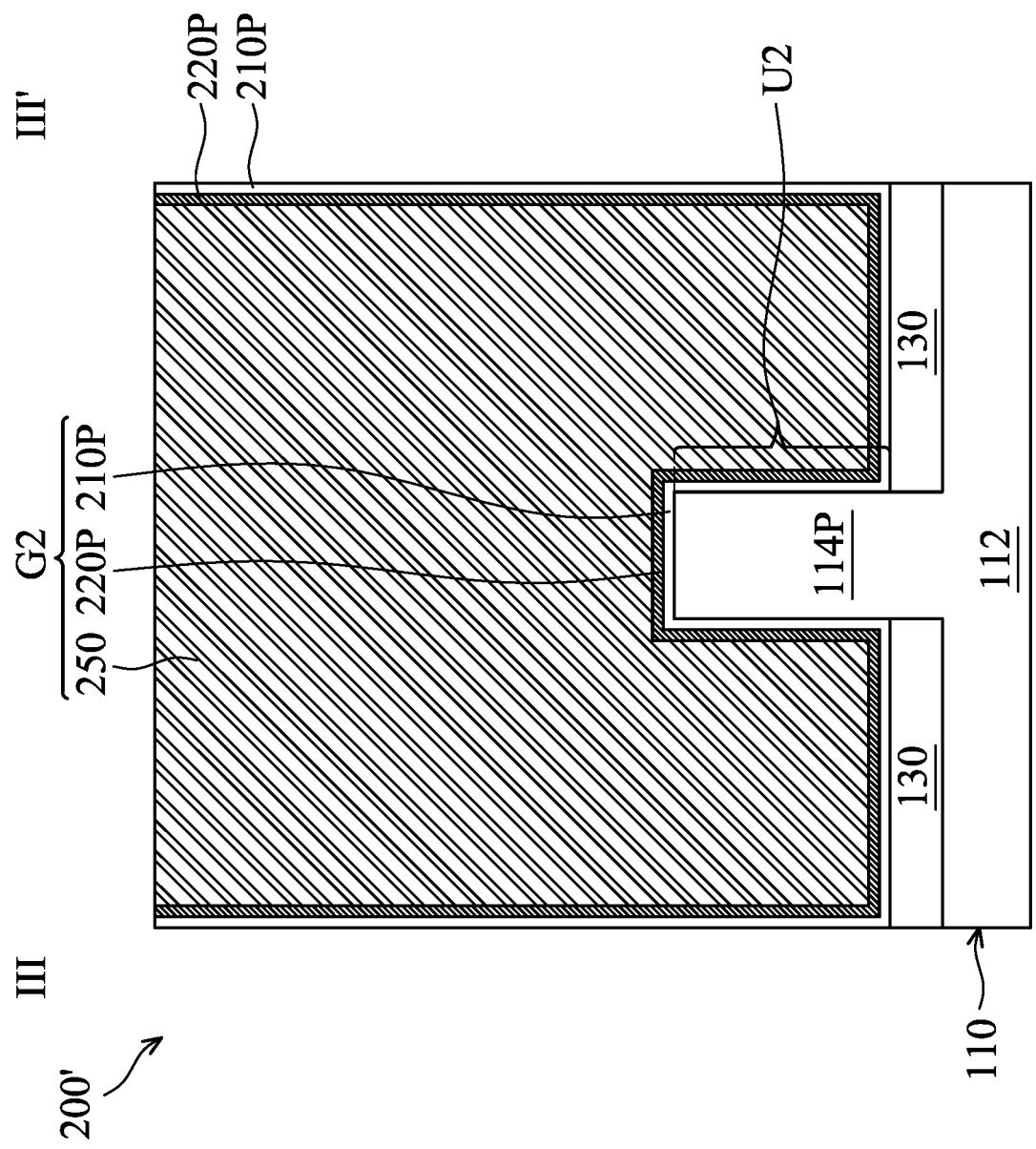
FIG. 2D is a cross-sectional view illustrating the semiconductor device structure along a sectional line in FIG. 2B, in accordance with some embodiments.

FIG. 2A is a cross-sectional view illustrating a semiconductor device structure 200', in accordance with some embodiments. FIG. 2B is a top view of the semiconductor device structure 200' of FIG. 2A, in accordance with some embodiments. FIG. 2A is a cross-sectional view illustrating the semiconductor device structure 200' along a sectional line I-I' in FIG. 2B, in accordance with some embodiments. FIG. 2C is a cross-sectional view illustrating the semiconductor device structure 200' along a sectional line II-IF in FIG. 2B, in accordance with some embodiments. FIG. 2D is a cross-sectional view illustrating the semiconductor device structure 200' along a sectional line III-III' in FIG. 2B, in accordance with some embodiments.

As shown in FIGS. 2A and 2B, the semiconductor device structure 200' is similar to the semiconductor device structure 100' of FIG. 1G, except that the semiconductor device structure 200' does not has the nanostructures 122N, 124N, 126N, 128N, 122P, 124P, 126P, and 128P and the inner spacer layer 170, in accordance with some embodiments. That is, the NMOS transistor 100N and the PMOS transistor 100P of the semiconductor device structure 200' are fin field-effect transistors (FinFET), in accordance with some embodiments.

As shown in FIGS. 2B and 2C, the gate stack G1 and the spacer structure 160 wrap around the upper portion U1 of the fin 114N, in accordance with some embodiments. As shown in FIGS. 2B and 2D, the gate stack G2 and the spacer structure 160 wrap around the upper portion U2 of the fin 114P, in accordance with some embodiments.

The upper portions U1 and U2 are also referred to as channel portions, in accordance with some embodiments. As shown in FIG. 2A, the fin 114N has a channel direction V1, in accordance with some embodiments. The channel direction V1 is [1 0 0], [−1 0 0], [0 1 0], or [0 −1 0], in accordance with some embodiments.

The fin 114P has a channel direction V2, in accordance with some embodiments. The channel direction V2 is [1 0 0], [−1 0 0], [0 1 0], or [0 −1 0], in accordance with some embodiments. In some embodiments, the channel directions V1 and V2 are the same as each other. In some other embodiments, the channel directions V1 and V2 are different from each other.

In some embodiments, the source/drain structures 180N are made of a semiconductor material and N-type dopants. The semiconductor material of the source/drain structures 180N and the semiconductor material of the substrate 110 are made of the same semiconductor material, in accordance with some embodiments. The lattice constant of the source/drain structures 180N and the lattice constant of the substrate 110 are substantially equal to each other, in accordance with some embodiments. The term "substantially equal to" means "within about 0.5%", in accordance with some embodiments.

In some embodiments, the source/drain structures 180P are made of a semiconductor material and P-type dopants. The semiconductor material of the source/drain structures 180P and the semiconductor material of the substrate 110 are made of the same semiconductor material, in accordance with some embodiments.

The lattice constant of the source/drain structures 180P and the lattice constant of the substrate 110 are substantially equal to each other, in accordance with some embodiments. The term "substantially equal to" means "within about 0.5%", in accordance with some embodiments.

Processes and materials for forming the semiconductor device structure 200' may be similar to, or the same as, those for forming the semiconductor device structure 100' described above.

In accordance with some embodiments, semiconductor device structures and methods for forming the same are provided. The methods (for forming the semiconductor device structure) form channels with a channel direction in a transistor. The channel direction is [1 0 0], [−1 0 0], [0 1 0], or [0 −1 0]. The carrier velocity in the aforementioned channel direction is high, which improves the driving current of the transistor. Therefore, the performance of the transistor is improved. The methods form source/drain structures with a semiconductor material, which is the same as that of the channels. Therefore, the lattice constant difference between the source/drain structures and the channels is reduced, which prevents dislocations from occurring and propagating in the source/drain structures adjacent to the channels. As a result, the yield of the transistor is improved. The valence band offset between the source/drain structures and the channels is reduced, which reduces the interface resistance therebetween. As a result, a driving current of the transistor is improved, which improves the performance of the transistor.

In accordance with some embodiments, a semiconductor device structure is provided. The semiconductor device structure includes a substrate. The semiconductor device structure includes a first nanostructure over the substrate. The first nanostructure has a (001) surface, the first nanostructure has a first channel direction on the (001) surface, and the first channel direction is [0 1 0] or [0 −1 0]. The semiconductor device structure includes a gate stack surrounding the first nanostructure. The semiconductor device structure includes a first source/drain structure and a second source/drain structure over the substrate and over opposite sides of the gate stack. The first nanostructure is between the first source/drain structure and the second source/drain structure, and the first channel direction is from the first source/drain structure to the second source/drain structure.

In accordance with some embodiments, a semiconductor device structure is provided. The semiconductor device structure includes a substrate having a base and a fin over the base. The fin has a (001) surface. The semiconductor device structure includes a gate stack wrapping around a channel portion of the fin. The semiconductor device structure includes a first source/drain structure and a second source/drain structure embedded in the fin and over opposite sides of the channel portion. The channel portion has a channel direction, the channel direction is from the first source/drain structure to the second source/drain structure, and the channel direction is [0 1 0] or [0 −1 0].

In accordance with some embodiments, a method for forming a semiconductor device structure is provided. The method includes providing a substrate having a base and a fin over the base. The fin has a (001) surface. The method includes forming a first gate stack over a channel portion of the fin. The method includes forming a first source/drain structure and a second source/drain structure in the fin. The channel portion is between the first source/drain structure and the second source/drain structure, the channel portion has a first channel direction, the first channel direction is from the first source/drain structure to the second source/drain structure, and the first channel direction is [0 1 0] or [0 −1 0].

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate;
    a first nanostructure over the substrate, wherein the first nanostructure has a (001) surface, the first nanostructure has a first channel direction on the (001) surface, and the first channel direction is [0 1 0] or [0 −1 0];
    a gate stack surrounding the first nanostructure; and
    a first source/drain structure and a second source/drain structure over the substrate and over opposite sides of the gate stack, wherein the first nanostructure is between the first source/drain structure and the second source/drain structure, and the first channel direction is from the first source/drain structure to the second source/drain structure.

2. The semiconductor device structure as claimed in claim 1, wherein the gate stack is in contact with the (001) surface of the first nanostructure.

3. The semiconductor device structure as claimed in claim 1, wherein the substrate has a base and a fin over the base, and the first nanostructure is over the fin.

4. The semiconductor device structure as claimed in claim 3, wherein an upper portion of the fin is between the first source/drain structure and the second source/drain structure, the upper portion has a second channel direction, and the second channel direction is the same as the first channel direction.

5. The semiconductor device structure as claimed in claim 1, wherein the substrate has a (001) surface.

6. The semiconductor device structure as claimed in claim 1, wherein a lower portion of a sidewall of the first source/drain structure is lower than a top surface of the substrate.

7. The semiconductor device structure as claimed in claim 1, wherein a first lattice constant of the first nanostructure is substantially equal to a second lattice constant of the first source/drain structure.

8. The semiconductor device structure as claimed in claim 1, wherein the first source/drain structure and the second source/drain structure are in direct contact with the first nanostructure.

9. The semiconductor device structure as claimed in claim 1, further comprising:
    a second nanostructure over the first nanostructure and having a (001) surface and a second channel direction, wherein the second channel direction is the same as the first channel direction.

10. A semiconductor device structure, comprising:
    a substrate having a base and a fin over the base, wherein the fin has a (001) surface;
    a gate stack wrapping around a channel portion of the fin; and a first source/drain structure and a second source/drain structure embedded in the fin and over opposite sides of the channel portion, wherein the channel portion has a channel direction, the channel direction is from the first source/drain structure to the second source/drain structure, and the channel direction is [0 1 0] or [0 −1 0].

11. The semiconductor device structure as claimed in claim 10, wherein the first source/drain structure has a (001) surface.

12. The semiconductor device structure as claimed in claim 10, wherein there is a lattice constant difference between the channel portion and the first source/drain structure, and a ratio of the lattice constant difference to an average of a first lattice constant of the channel portion and a second lattice constant of the first source/drain structure ranges from about 0 to about 0.5%.

13. The semiconductor device structure as claimed in claim 10, wherein a portion of the fin is between the first source/drain structure and the base.

14. A method for forming a semiconductor device structure, comprising:
providing a substrate having a base and a fin over the base, wherein the fin has a (001) surface;
forming a first gate stack over a channel portion of the fin; and
forming a first source/drain structure and a second source/drain structure in the fin, wherein the channel portion is between the first source/drain structure and the second source/drain structure, the channel portion has a first channel direction, the first channel direction is from the first source/drain structure to the second source/drain structure, and the first channel direction is [0 1 0] or [0 −1 0].

15. The method for forming the semiconductor device structure as claimed in claim 14, further comprising:
forming a nanostructure over the fin before forming the first gate stack over the channel portion of the fin, wherein the first gate stack wraps around the nanostructure.

16. The method for forming the semiconductor device structure as claimed in claim 15, wherein the nanostructure has a second channel direction, and the second channel direction is the same as the first channel direction of the channel portion of the fin.

17. The method for forming the semiconductor device structure as claimed in claim 16, wherein a first lattice constant of the nanostructure is substantially equal to a second lattice constant of the first source/drain structure.

18. The method for forming the semiconductor device structure as claimed in claim 14, wherein a first lattice constant of the fin is substantially equal to a second lattice constant of the first source/drain structure.

19. The method for forming the semiconductor device structure as claimed in claim 14, wherein a portion of the fin is between the first source/drain structure and the base.

20. The method for forming the semiconductor device structure as claimed in claim 14, further comprising:
forming a first nanostructure and a second nanostructure over the fin before the first gate stack is formed over the channel portion of the fin, wherein the first nanostructure is between the fin and the second nanostructure, the second nanostructure has a (001) surface, and the first gate stack is further formed over a first portion of the first nanostructure and a second portion of the second nanostructure;
partially removing the first nanostructure, the second nanostructure, and the fin, which are not covered by the first gate stack, to form a first recess and a second recess passing through the first nanostructure and the second nanostructure and extending into the fin, wherein the first source/drain structure and the second source/drain structure are formed in the first recess and the second recess respectively, and a sidewall of the first source/drain structure continuously extends across the (001) surface of the fin and the (001) surface of the second nanostructure in a cross-sectional view of the first source/drain structure, the fin, and the second nanostructure;
removing the first gate stack and the first nanostructure; and
forming a second gate stack over the fin and the second nanostructure, wherein the second gate stack is in contact with the (001) surface of the fin and the (001) surface of the second nanostructure.

* * * * *